US012721234B2

(12) United States Patent
Jee

(10) Patent No.: US 12,721,234 B2
(45) Date of Patent: Aug. 25, 2026

(54) SEMICONDUCTOR PACKAGE AND METHOD FOR FABRICATING THE SAME

(71) Applicant: SAMSUNG ELECTRONICS CO., LTD., Suwon-si (KR)

(72) Inventor: Young Kun Jee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 334 days.

(21) Appl. No.: 18/615,484

(22) Filed: Mar. 25, 2024

(65) Prior Publication Data

US 2025/0079362 A1 Mar. 6, 2025

(30) Foreign Application Priority Data

Aug. 31, 2023 (KR) ........................ 10-2023-0115145

(51) Int. Cl.

*H10W 90/00* (2026.01)
*H10W 20/20* (2026.01)
*H10W 72/90* (2026.01)
*H10W 74/10* (2026.01)

(52) U.S. Cl.

CPC ........... *H10W 90/00* (2026.01); *H10W 20/20* (2026.01); *H10W 74/117* (2026.01); *H10W 72/926* (2026.01); *H10W 72/952* (2026.01); *H10W 90/792* (2026.01)

(58) Field of Classification Search

CPC ... H10W 90/00; H10W 20/20; H10W 74/117; H10W 72/926; H10W 72/952; H10W 90/792; H10W 90/297; H10W 20/01; H10W 20/43; H10W 72/012; H10W 72/234; H10W 72/241; H10W 72/823; H10W 72/923; H10W 80/301; H10W 72/01; H10B 80/00

See application file for complete search history.

(56) References Cited

U.S. PATENT DOCUMENTS 8,193,023 B2 6/2012 Ahn
9,991,244 B2 6/2018 Lin
10,847,661 B2 11/2020 Sato
10,998,293 B2 * 5/2021 Chen ..................... H10W 90/00
11,011,486 B1 5/2021 Yang (Continued)

FOREIGN PATENT DOCUMENTS

KR 20190087897 7/2019

*Primary Examiner* — Allison Bernstein

(74) *Attorney, Agent, or Firm* — Fish & Richardson P.C.

(57) ABSTRACT

The present disclosure relates to semiconductor packages. An example semiconductor package comprises a first semiconductor chip, a second semiconductor chip on the first semiconductor chip, a first bonding pad disposed on a first surface of the first semiconductor chip facing the second semiconductor chip, and a second bonding pad disposed on a second surface of the second semiconductor chip facing the first surface. The second bonding pad is in contact with the first bonding pad, and includes a third surface in contact with the first bonding pad and a fourth surface opposite to the third surface. The second semiconductor chip includes a first wiring pad in contact with the fourth surface and a second wiring pad spaced apart from the first wiring pad and the second bonding pad. A thickness of the second wiring pad is smaller than a thickness of the first wiring pad.

20 Claims, 33 Drawing Sheets

(56) References Cited

U.S. PATENT DOCUMENTS

| | | | | |
|---|---|---|---|---|
| 11,456,353 | B2 | 9/2022 | Kang et al. | |
| 2014/0175655 | A1 | 6/2014 | Chen et al. | |
| 2023/0378110 | A1 * | 11/2023 | Kim | H10B 43/40 |
| 2023/0411327 | A1 * | 12/2023 | Tagami | H10B 43/27 |

* cited by examiner

FIG. 2

P
205
TH244
TH242
THB
100S2
200S1
225
230
210
240
220
244
242
250
610
160
110
130
244S2
242S2
244S1
250S2
242S1
250S1
160S1

SEMICONDUCTOR PACKAGE AND METHOD FOR FABRICATING THE SAME

CROSS-REFERENCE TO RELATED APPLICATION

This application claims priority, under 35 U.S.C. 119, from Korean Patent Application No. 10-2023-0115145 filed on Aug. 31, 2023 in the Korean Intellectual Property Office, the entire contents of which are herein incorporated by reference.

BACKGROUND

With the development of the electronics industry, demands for higher functionality, higher speed, and smaller size of electronic components are increasing. In response to this trend, a method for stacking and mounting a plurality of semiconductor chips on a single package wiring structure, or stacking packages on top of each other may be used.

In recent years, an interconnected length between stacked chips is reduced, by using direct bonding to vertically stack a plurality of dies.

SUMMARY

The present disclosure relates to semiconductor packages and semiconductor package fabricating methods, including a semiconductor package having improved product reliability.

In general, according to some aspects, a semiconductor package comprises a first semiconductor chip, a second semiconductor chip on the first semiconductor chip, a first bonding pad which is disposed on a first surface of the first semiconductor chip facing the second semiconductor chip and a second bonding pad which is disposed on a second surface of the second semiconductor chip facing the first surface, and is in contact with the first bonding pad, wherein the second bonding pad includes a third surface that is in contact with the first bonding pad, and a fourth surface opposite to the third surface, wherein the second semiconductor chip includes a first wiring pad that is in contact with the fourth surface of the second bonding pad, and a second wiring pad which is spaced apart from the first wiring pad and not in contact with the second bonding pad, wherein a thickness of the second wiring pad is smaller than a thickness of the first wiring pad.

In general, according to some aspects, a semiconductor package comprises a first semiconductor chip, a second semiconductor chip on the first semiconductor chip, a first bonding pad which is disposed on a first surface of the first semiconductor chip facing the second semiconductor chip and a second bonding pad which is disposed on a second surface of the second semiconductor chip facing the first surface, and is in contact with the first bonding pad, wherein the second semiconductor chip includes a first wiring pad which is in contact with the second bonding pad, and a second wiring pad which is spaced apart from the first wiring pad, and is not in contact with the second bonding pad, wherein the first wiring pad includes a third surface that is in contact with the second bonding pad, and a fourth surface opposite to the third surface, wherein the second wiring pad includes a fifth surface facing the first semiconductor chip, and a sixth surface opposite to the fifth surface, the fourth surface and the sixth surface are disposed on the same plane, and the third surface is located below the fifth surface on the basis of the first surface of the first semiconductor chip.

In general, according to some aspects, a semiconductor package comprises a package substrate, a first semiconductor chip on the package substrate, a second semiconductor chip on the first semiconductor chip, a first bonding pad which is disposed on a first surface of the first semiconductor chip facing the second semiconductor chip, a second bonding pad which is disposed on a second surface of the second semiconductor chip facing the first surface, and is in contact with the first bonding pad and a molding film which is disposed on the package substrate, and covers the first semiconductor chip and the second semiconductor chip, wherein the second bonding pad includes a third surface that is in contact with the first bonding pad, and a fourth surface opposite to the third surface, the first semiconductor chip includes a first through electrode that is in contact with the first bonding pad, and a first wiring structure connected to the first through electrode, wherein the second semiconductor chip includes a first wiring pad that is in contact with the fourth surface of the second bonding pad, a second wiring structure including a second wiring pad that is spaced apart from the first wiring pad and not in contact with the second bonding pad, and a second through electrode connected to the second wiring structure, wherein the first bonding pad and the second bonding pad include copper, the first wiring pad and the second wiring pad include aluminum, and a thickness of the second wiring pad is 50% or less of a thickness of the first wiring pad.

In general, according to some aspects, a method for fabricating a semiconductor package comprises forming a first bonding pad on a first surface of a first semiconductor chip, forming a first wiring pad of a first thickness and a second wiring pad of a second thickness smaller than the first thickness, on a second surface of the second semiconductor chip, forming an insulating film which surrounds a side face of the first wiring pad and covers the second wiring pad, on the second surface of the second semiconductor chip, forming a second bonding pad on the first wiring pad and bonding the first bonding pad and the second bonding pad.

However, aspects of the present disclosure are not restricted to the one set forth herein. The above and other aspects of the present disclosure will become more apparent to one of ordinary skill in the art to which the present disclosure pertains by referencing the detailed explanation of the present disclosure given below.

BRIEF DESCRIPTION OF THE DRAWINGS

The above and other aspects and features of the present disclosure will become more apparent by describing in detail illustrative implementations thereof with reference to the attached drawings, in which:

FIG. 2 is an example enlarged view of a portion P of FIG. 1.

FIGS. 3 to 7 are diagrams illustrating another example of a semiconductor package.

FIG. 8 is a diagram illustrating another example of a semiconductor package.

FIG. 12 is an example enlarged view showing a portion R of FIG. 11.

FIGS. 14 to 27 are diagrams illustrating intermediate steps of an example of a method for fabricating a semiconductor package.

FIGS. 28 to 33 are diagrams illustrating intermediate steps of another example of a method for fabricating a semiconductor package.

DETAILED DESCRIPTION

Hereinafter, implementations of the present disclosure will be described with reference to the accompanying drawings.

Figure 1:
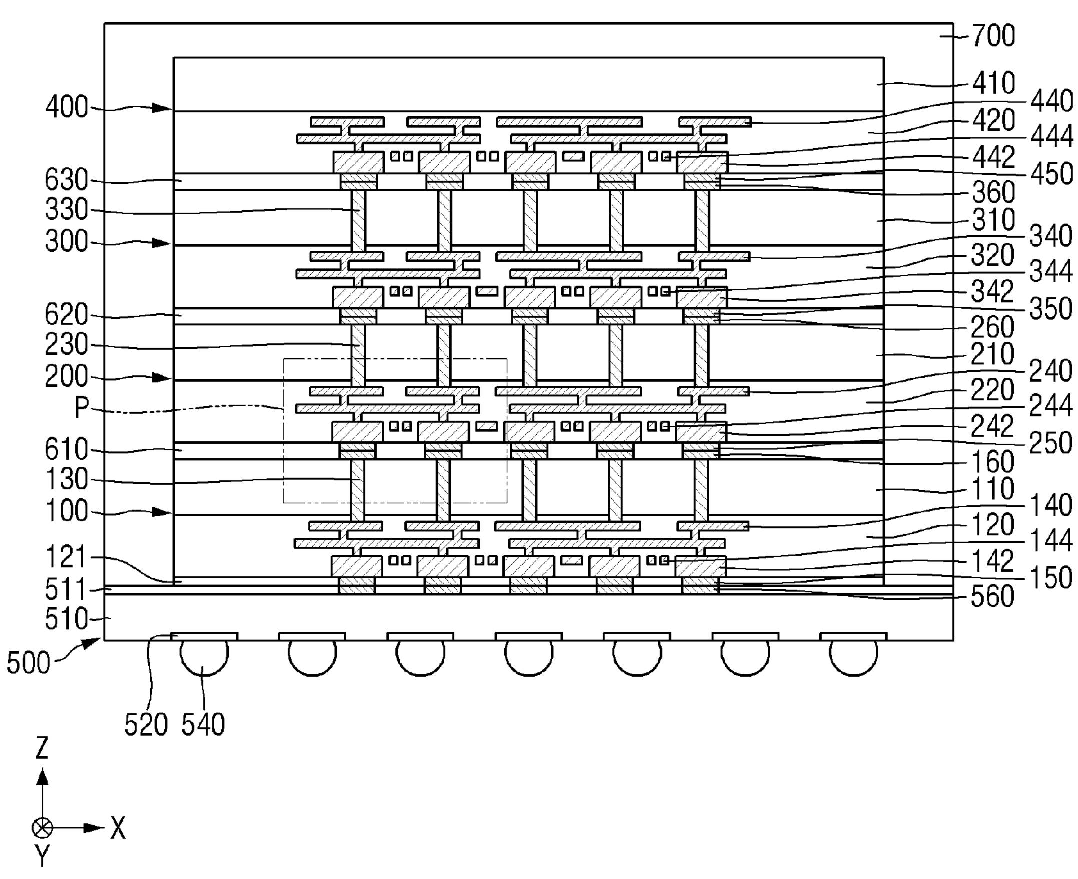
FIG. 1 is a diagram illustrating an example of a semiconductor package.
Figure 2:
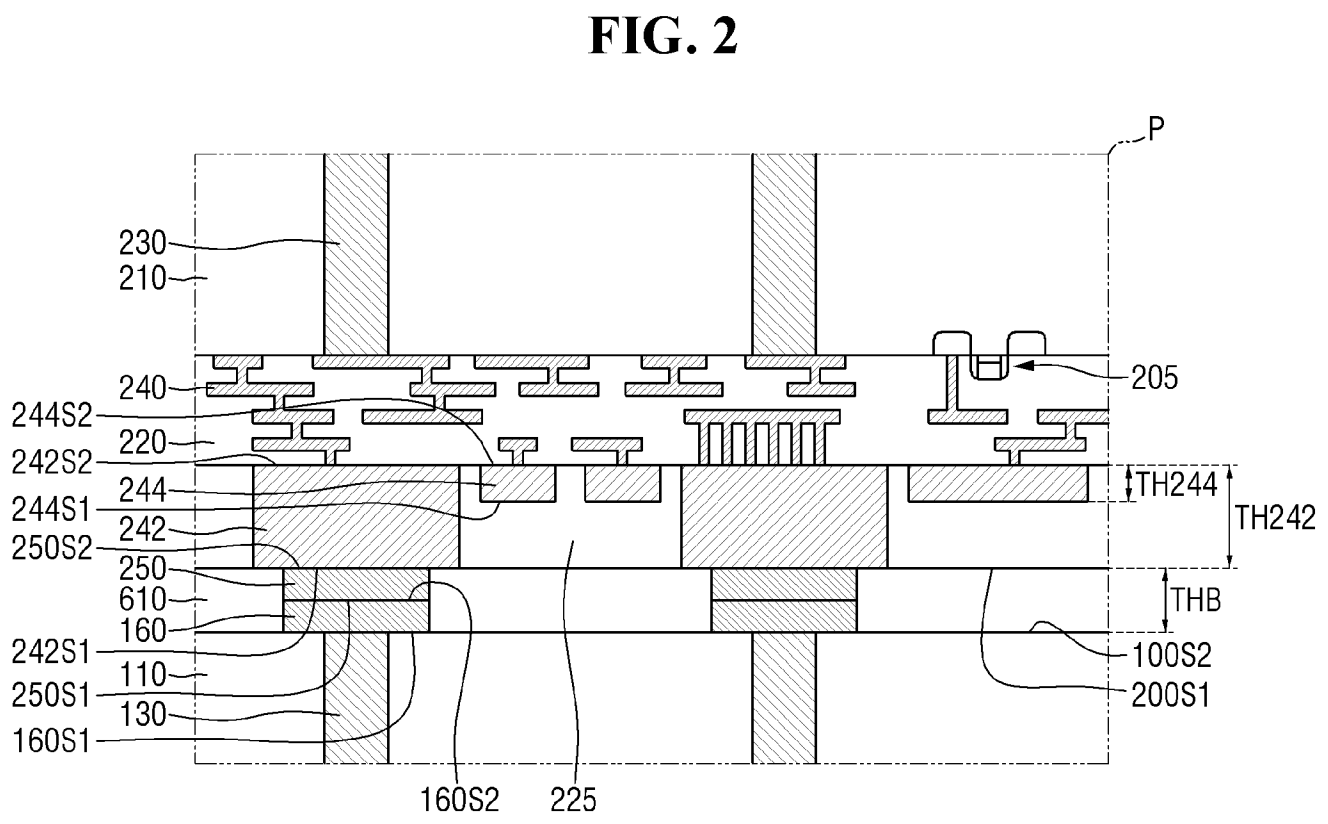

FIG. 1 is a diagram illustrating an example of a semiconductor package. FIG. 2 is an example enlarged view of a portion P of FIG. 1.

Referring to FIGS. 1 and 2, the semiconductor package includes first to fourth semiconductor chips 100 to 400, a package substrate 500, back bonding pads 150, 250, 350, and 450, front bonding pads 160, 260, and 360, bonding insulation films 610, 620, and 630, connection wiring pads 142, 242, 342, and 442, peripheral wiring pads 144, 244, 344, and 444, and a molding film 700.

The explanation of the back bonding pads 150, 250, 350, and 450 may be substantially the same as the explanation of the first back bonding pad 150 and the second back bonding pad 250. Therefore, the following explanation will focus on the first back bonding pad 150 and the second back bonding pad 250.

The explanation of the front bonding pads 160, 260, and 360 and the package bonding pad 560 may be substantially the same as the explanation of a first front bonding pad 160. Therefore, the first front bonding pad 160 will be mainly described below.

The explanation of the connection wiring pads 142, 242, 342, and 442 may be substantially the same as the explanation of a first connection wiring pad 142 and the second connection wiring pad 242. Therefore, the following description will focus on the first connection wiring pad 142 and the second connection wiring pad 242.

The explanation of the peripheral wiring pads 144, 244, 344, and 444 may be substantially the same as the explanation of the first peripheral wiring pad 144 and the second peripheral wiring pad 244. Therefore, the following explanation of will focus on the first peripheral wiring pad 144 and the second peripheral wiring pad 244.

The first to fourth semiconductor chips 100 to 400 may be logic chips or memory chips. The first to fourth semiconductor chips 100 to 400 may all be memory chips of the same type. For example, the first to fourth semiconductor chips 100 to 400 may be volatile memory chips such as a DRAM (Dynamic Random Access Memory) or a SRAM (Static Random Access Memory). As another example, the first to fourth semiconductor chips 100 to 400 may be nonvolatile memory chips such as a PRAM (Phase-change RAM), a MRAM (Magnetoresistive RAM), a FeRAM (Ferroelectric RAM) or a RRAM (Resistive RAM). As still another example, the first to fourth semiconductor chips 100 to 400 may be a HBM (High Bandwidth Memory).

Furthermore, some of the first to fourth semiconductor chips 100 to 400 may be memory chips, and others thereof may be logic chips. For example, some of the first to fourth semiconductor chips 100 to 400 may be a microprocessor, an analog element, a digital signal processor or an application processor.

The first to fourth semiconductor chips 100 to 400 may be stacked on the package substrate 500 in a vertical direction. The first to fourth semiconductor chips 100 to 400 may be electrically connected to each other through the back bonding pads 150, 250, 350, and 450 and the front bonding pads 160, 260, and 360, or may be electrically connected to the package substrate 500.

The widths of the first to fourth semiconductor chips 100 to 400 may be equal to each other. The side faces of the first to fourth semiconductor chips 100 to 400 may be disposed on the same plane.

The first semiconductor chip 100 may include a first semiconductor substrate 110, a first semiconductor element layer 120, a first through electrode 130, a first wiring structure 140, a first connection wiring pad 142, a first peripheral wiring pad 144, a first back bonding pad 150, and a first front bonding pad 160.

The first semiconductor substrate 110 may be, for example, bulk silicon or silicon-on-insulator (SOI). As another example, the first semiconductor substrate 110 may be a silicon substrate. As still another example, the first semiconductor substrate 110 may include, but not limited to, silicon germanium, SGOI (silicon germanium on insulator), indium antimonide, lead telluride, indium arsenide, indium phosphide, gallium arsenide or gallium antimonide.

The first semiconductor substrate 110 may include a conductive region, for example, an impurity-doped well or an impurity-doped structure. The first semiconductor substrate 110 may have various element isolation structures, such as a shallow trench isolation (STI) structure.

The first semiconductor element layer 120 may be disposed on the lower face of the first semiconductor substrate 110. The first semiconductor element layer 120 may include a plurality of various types of individual devices and an interlayer insulating film. The individual devices may include various microelectronic devices, for example, a MOSFET (metal-oxide-semiconductor field effect transformer) such as a CMOS transistor (complementary metal-insulator-semiconductor transistor), a system LSI (large scale integration), a flash memory, a DRAM, a SRAM, an EEPROM, a PRAM, a MRAM, a RRAM, an image sensor such as a CIS (CMOS imaging sensor), a MEMS (micro-electro-mechanical system), an active device, a passive device, and the like.

The individual devices of the first semiconductor element layer 120 may be electrically connected to conductive regions formed inside the first semiconductor substrate 110. The individual devices of the first semiconductor element layer 120 may be electrically separated from other adjacent individual devices by insulating films. The first semiconductor element layer 120 may include a first wiring structure 140 that electrically connects at least two of the plurality of individual devices or a plurality of individual devices and the conductive region of the first semiconductor substrate 110.

The first semiconductor element layer 120 may include a first connection wiring pad 142 and a first peripheral wiring pad 144. The first connection wiring pad 142 and the first peripheral wiring pad 144 may be disposed inside the first semiconductor element layer 120.

The first connection wiring pad 142 and the first peripheral wiring pad 144 may be spaced apart from each other. For example, the first connection wiring pad 142 and the first peripheral wiring pad 144 may be horizontally spaced apart at the same level. For example, the first connection wiring pad 142 and the first peripheral wiring pad 144 may be spaced apart from each other in a first direction X.

The first connection wiring pad 142 may be connected to the first wiring structure 140 and the first back bonding pad 150. The first connection wiring pad 142 may be in contact with the first wiring structure 140 and the first back bonding pad 150. A lower face of the first connection wiring pad 142 may be in contact with an upper face of the first back bonding pad 150. The first connection wiring pad 142 may electrically connect the first wiring structure 140 to the first back bonding pad 150.

The first peripheral wiring pad 144 may be connected to the first wiring structure 140. The first peripheral wiring pad 144 may be in contact with the first wiring structure 140. The first peripheral wiring pad 144 may not be connected to the first back bonding pad 150. The first peripheral wiring pad 144 may not be in contact with the first back bonding pad 150. A lower face of the first peripheral wiring pad 144 may be spaced apart from an upper face of the first back bonding pad 150. The lower face of the first peripheral wiring pad 144 may be covered with an insulating film inside the first semiconductor element layer 120. The lower face of the first peripheral wiring pad 144 may be surrounded by an insulating film inside the first semiconductor element layer 120.

The first connection wiring pad 142 and the first peripheral wiring pad 144 may include at least one of aluminum (Al) and copper (Cu). For example, the first connection wiring pad 142 and the first peripheral wiring pad 144 may each include aluminum (Al).

Although a width of the first peripheral wiring pad 144 is shown as being smaller than a width of the first connection wiring pad 142 in the first direction X, the implementation is not limited thereto. For example, the width of the first peripheral wiring pad 144 may be larger than the width of the first connection wiring pad 142.

A first passivation layer 121 for protecting structures different from the first wiring structure 140, the first connection wiring pad 142, and the first peripheral wiring pad 144 inside the first semiconductor element layer 120 from external impact and moisture may be formed on the first semiconductor element layer 120. The first passivation layer 121 may expose a part of the lower face of the first connection wiring pad 142.

The first through electrode 130 may penetrate the first semiconductor substrate 110. The first through electrode 130 may extend from the upper face of the first semiconductor substrate 110 toward the lower face. The first through electrode 130 may be connected to the first wiring structure 140 provided in the first semiconductor element layer 120.

The first through electrode 130 may include a barrier film formed on a columnar surface and a buried conductive layer for filling the inside of the barrier film. The barrier film may include, but not limited to, at least one of Ti, TiN, Ta, TaN, Ru, Co, Mn, WN, Ni, and NiB. The buried conductive layer may include, but not limited to, at least one of Cu alloys such as Cu, CuSn, CuMg, CuNi, CuZn, CuPd, CuAu, CuRe, and CuW, W, W alloys, Ni, Ru, and Co.

In some implementations, the insulating film may be interposed between the first semiconductor substrate 110 and the first through electrode 130. The insulating film may include, but not limited to, an oxide film, a nitride film, a carbide film, a polymer, or a combination thereof.

The first wiring structure 140 may include a metal wiring layer and a via plug. For example, the first wiring structure 140 may have a multilayer structure in which two or more metal wiring layers or two or more via plugs are alternately stacked.

The first wiring structure 140 may be connected to a first connection wiring pad 142 and a first peripheral wiring pad 144. The first wiring structure 140 may be in contact with the first connection wiring pad 142 and the first peripheral wiring pad 144.

The first back bonding pad 150 may be disposed on the first semiconductor element layer 120. The first back bonding pad 150 may be electrically connected to the first wiring structure 140 inside the first semiconductor element layer 120. The first back bonding pad 150 may be electrically connected to the first through electrode 130 through the first wiring structure 140.

The first back bonding pad 150 may be disposed on the first connection wiring pad 142. The first back bonding pad 150 may be connected to the first connection wiring pad 142. The first back bonding pad 150 may be in contact with the first connection wiring pad 142. For example, an upper face of the first back bonding pad 150 may be in contact with a lower face of the first connection wiring pad 142.

The first back bonding pad 150 may not be connected to the first peripheral wiring pad 144. The first back bonding pad 150 may not be in contact with the first peripheral wiring pad 144. The first back bonding pad 150 may be spaced apart from the first peripheral wiring pad 144. An upper face of the first back bonding pad 150 may be spaced apart from a lower face of the first peripheral wiring pad 144.

The first back bonding pad 150 may be electrically connected to the package bonding pad 560. The first back bonding pad 150 may be in contact with the package bonding pad 560. The first back bonding pad 150 may be bonded to the package bonding pad 560. The first back bonding pad 150 and the package bonding pad 560 may be directly bonded. The first back bonding pad 150 and the package bonding pad 560 may be coupled through a high-temperature annealing process.

The first semiconductor chip 100 may be electrically connected to the package substrate 500 by bonding the first back bonding pad 150 and the package bonding pad 560. For example, by coupling the first back bonding pad 150 and the package bonding pad 560, the first connection wiring pad 142 and the first wiring structure 140 connected to the first back bonding pad 150 may be electrically connected to the back bonding pad 560 of the package substrate 500.

The first back bonding pad 150 may be provided with at least one of a control signal, a power signal or a ground signal for operating the first to fourth semiconductor chips 100 to 400 from the outside. The first back bonding pad 150 may be provided with a data signal to be stored in the first to fourth semiconductor chips 100 to 400 from the outside. The first back bonding pad 150 may provide data stored in the first to fourth semiconductor chips 100 to 400 to the outside.

The first back bonding pad 150 may include at least one selected from aluminum (Al), copper (Cu), nickel (Ni), tungsten (W), platinum (Pt), and gold (Au). In some implementations, the first back bonding pad 150 may include copper (Cu).

The first front bonding pad 160 electrically connected to the first through electrode 130 may be formed on the upper face of the first semiconductor substrate 110. The first front bonding pad 160 may be electrically connected to the first wiring structure 140 through the first through electrode 130. The first front bonding pad 160 may be made of the same material as the first back bonding pad 150. Although not shown, an upper passivation layer may be formed on the upper face of the first semiconductor substrate 110 to surround a part of the side face of the first through electrode 130.

The first front bonding pad 160 may be connected to the second back bonding pad 250. The first front bonding pad 160 may be in contact with the second back bonding pad 250. For example, a second surface 160S2 of the first front bonding pad may be in contact with a first surface 250S1 of the second back bonding pad.

The first front bonding pad 160 may be bonded to the second back bonding pad 250. The first front bonding pad 160 may be directly bonded to the second back bonding pad 250. The first front bonding pad 160 and the second back bonding pad 250 may be coupled by a high-temperature annealing process.

The first front bonding pad 160 may be disposed on the second surface 100S2 of the first semiconductor chip. The second surface 100S2 of the first semiconductor chip may be opposite to the second semiconductor chip 200. For example, the second surface 100S2 of the first semiconductor chip may face the first surface 200S1 of the second semiconductor chip. The first front bonding pad 160 may be disposed inside the first bonding insulation film 610.

The second semiconductor chip 200 may be electrically connected to the first semiconductor chip 100 by bonding the first front bonding pad 160 and the second back bonding pad 250. For example, the first through electrode 130 of the first semiconductor chip 100 and the second wiring structures 240 of the second semiconductor chip 200 may be electrically connected through the bonded first front bonding pad 160 and second back bonding pad 250.

The first front bonding pad 160 and the second back bonding pad 250 may be surrounded by the first bonding insulation film 610. A side face of the first front bonding pad 160 and a side face of the second back bonding pad 250 may be covered with the first bonding insulation film 610.

The first front bonding pad 160 and the second back bonding pad 250 may be bonded with a bonding thickness THB. The bonding thickness THB may refer to a thickness between the first surface 160S1 of the first front bonding pad and the second surface 250S2 of the second back bonding pad. The first surface 160S1 of the first front bonding pad may be a face on which the first front bonding pad 160 is in contact with the second surface 100S2 of the first semiconductor chip. The second surface 250S2 of the second back bonding pad may be a face on which the second back bonding pad 250 is in contact with the first surface 200S1 of the second semiconductor chip.

The bonding thickness THB may be smaller than a thickness TH242 of the second connection wiring pad. However, the implementations are not limited thereto. For example, the bonding thickness THB may be greater than a thickness TH242 of the second connection wiring pad.

A width of the first front bonding pad 160 may be the same as a width of the second back bonding pad 250. For example, a side face of the first front bonding pad 160 and a side face of the second back bonding pad 250 may be disposed on the same plane. The width of the first front bonding pad 160 may be greater than the width of the first through electrode 130.

The thickness of the first front bonding pad 160 may be the same as the thickness of the second back bonding pad 250. The thickness between the first surface 160S1 of the first front bonding pad and the second surface 160S2 of the first front bonding pad may be the same as the thickness between the first surface 250S1 of the second back bonding pad and the second surface 250S2 of the second back bonding pad.

The second semiconductor chip 200 may be disposed on the first semiconductor chip 100. The second semiconductor chip 200 may be electrically connected to the first semiconductor chip 100 through the first front bonding pad 160 and the second back bonding pad 250 which are disposed between the first semiconductor chip 100 and the second semiconductor chip 200.

The second semiconductor chip 200 may include a second semiconductor substrate 210, a second semiconductor element layer 220, a second through electrode 230, a second wiring structure 240, a second connection wiring pad 242, a second peripheral wiring pad 244, a second back bonding pad 250, and a second front bonding pad 260.

The second semiconductor element layer 220 may include a second connection wiring pad 242 and a second peripheral wiring pad 244. The second connection wiring pad 242 and the second peripheral wiring pad 244 may be disposed inside the second semiconductor element layer 220.

The second connection wiring pad 242 and the second peripheral wiring pad 244 may be spaced apart from each other. For example, the second connection wiring pad 242 and the second peripheral wiring pad 244 may be spaced apart from each other in a horizontal direction at the same level. For example, the second connection wiring pad 242 and the second peripheral wiring pad 244 may be spaced apart from each other in the first direction X.

The second connection wiring pad 242 and the second peripheral wiring pad 244 may have different thicknesses from each other. The thickness TH242 of the second connection wiring pad may be greater than the thickness TH244 of the second peripheral wiring pad. The thickness TH242 of the second connection wiring pad may refer to a thickness between the first surface 242S1 and the second surface 242S2 of the second connection wiring pad. The thickness TH244 of the second peripheral wiring pad may refer to a thickness between the first surface 244S1 and the second surface 244S2 of the second peripheral wiring pad.

The thickness TH244 of the second peripheral wiring pad may be, for example, 50% or less of the thickness TH242 of the second connection wiring pad. The thickness TH242 of the second connection wiring pad may be greater than the bonding thickness THB at which the second back bonding pad 250 and the first front bonding pad 160 are bonded.

The second surface 242S2 of the second connection wiring pad and the second surface 244S2 of the second peripheral wiring pad may be disposed on the same plane.

The second surface 242S2 of the second connection wiring pad may be a face that is opposite to the first surface 242S1 of the second connection wiring pad. The first surface 242S1 of the second connection wiring pad may be a face that is in contact with the second back bonding pad 250. The first surface 242S1 of the second connection wiring pad may face the first semiconductor chip 100. The second wiring structure 240 may be in contact with the second surface 242S2 of the second connection wiring pad. The second wiring structure 240 may be connected to the second surface 242S2 of the second connection wiring pad.

The second surface 244S2 of the second peripheral wiring pad may be a face that is opposite to the first surface 244S1 of the second peripheral wiring pad. The first surface 244S1 of the second peripheral wiring pad may face the first semiconductor chip 100. The first surface 244S1 of the second peripheral wiring pad may be covered with the second insulating film 225 inside the second semiconductor element layer 220. The second wiring structure 240 may be in contact with the second surface 244S2 of the second peripheral wiring pad. The second wiring structure 240 may be connected to the second surface 244S2 of the second peripheral wiring pad.

The first surface 242S1 of the second connection wiring pad and the first surface 244S1 of the second peripheral wiring pad may not be disposed on the same plane. For example, on the basis of the second surface 100S2 of the first semiconductor chip, the first surface 242S1 of the second connection wiring pad may be disposed below the first surface 244S1 of the second peripheral wiring pad. The first surface 242S1 of the second connection wiring pad and the first surface 244S1 of the second peripheral wiring pad may have a level difference.

The first surface 242S1 of the second connection wiring pad may not be covered with the second insulating film 225 inside the second semiconductor element layer 220. The first surface 242S1 of the second connection wiring pad may not overlap the second insulating film 225 inside the second semiconductor element layer 220. For example, the second insulating film 225 may not be disposed between the second connection wiring pad 242 and the second back bonding pad 250. The first surface 242S1 of the second connection wiring pad and the second surface 250S2 of the second back bonding pad may be in direct contact with each other. Only the side faces of the second connection wiring pad 242 may be surrounded by the second insulating film 225 inside the second semiconductor element layer 220.

The first surface 244S1 of the second peripheral wiring pad may be covered with the second insulating film 225 inside the second semiconductor element layer 220. The first surface 244S1 of the second peripheral wiring pad may overlap the second insulating film 225 inside the second semiconductor element layer 220. The second insulating film 225 may be disposed between the second peripheral wiring pad 244 and the first bonding insulation film 610. The second peripheral wiring pad 244 may be surrounded by the second insulating film 225 inside the second semiconductor element layer 220 not only on the side face but also on the first surface 244S1.

The second back bonding pad 250 may be disposed on the second semiconductor element layer 220. The second back bonding pad 250 may be electrically connected to the second wiring structure 240 inside the second semiconductor element layer 220. The second back bonding pad 250 may be electrically connected to the second through electrode 230 through the second wiring structure 240.

The second back bonding pad 250 may be disposed on the first surface 200S1 of the second semiconductor chip. For example, the first surface 200S1 of the second semiconductor chip may face the second surface 100S2 of the first semiconductor chip. The second back bonding pad 250 may be disposed inside the first bonding insulation film 610.

The second back bonding pad 250 may be disposed on the second connection wiring pad 242. The second back bonding pad 250 may be connected to the second connection wiring pad 242. The second back bonding pad 250 may be in contact with the second connection wiring pad 242. For example, the second surface 250S2 of the second back bonding pad may be in contact with the first surface 242S1 of the second connection wiring pad.

The second back bonding pad 250 may not be connected to the second peripheral wiring pad 244. The second back bonding pad 250 may not be in contact with the second peripheral wiring pad 244. The second back bonding pad 250 may be spaced apart from the second peripheral wiring pad 244. The second surface 250S2 of the second back bonding pad may be spaced apart from the first surface 244S1 of the second peripheral wiring pad.

The second back bonding pad 250 may be electrically connected to the first front bonding pad 160. The second back bonding pad 250 may be in contact with the first front bonding pad 160. The second back bonding pad 250 may be bonded to the first front bonding pad 160. The second back bonding pad 250 and the first front bonding pad 160 may be directly bonded. The second back bonding pad 250 and the first front bonding pad 160 may be coupled through a high-temperature annealing process.

The second back bonding pad 250 and the first front bonding pad 160 may be bonded to electrically connect the second semiconductor chip 200 to the first semiconductor chip 100. For example, since the second back bonding pad 250 and the first front bonding pad 160 is in contact with each other, the second connection wiring pad 242 and the second wiring structure 240 connected to the second back bonding pad 250 may be electrically connected to the first through electrode 130 of the first semiconductor chip 100.

A third semiconductor chip 300 may be disposed on the second semiconductor chip 200. The third semiconductor chip 300 may include a third semiconductor substrate 310, a third semiconductor element layer 320, a third through electrode 330, a third wiring structure 340, a third connection wiring pad 342, a third peripheral wiring pad 344, a third back bonding pad 350, and a third front bonding pad 360.

The fourth semiconductor chip 400 may be disposed on the third semiconductor chip 300. The fourth semiconductor chip 400 may include a fourth semiconductor substrate 410, a fourth semiconductor element layer 420, a fourth wiring structure 440, a fourth connection wiring pad 442, a fourth peripheral wiring pad 444, and a fourth back bonding pad 450. The fourth semiconductor chip 400 may not include a through electrode and a front bonding pad, unlike the first to third semiconductor chips 100 to 300.

The second to fourth semiconductor chips 200 to 400 may be substantially the same as or similar to the first semiconductor chip 100. Therefore, detailed explanation of the second to fourth semiconductor chips 200 to 400 will not be provided.

The package substrate 500 may be, for example, a printed circuit board (PCB), a ceramic substrate or an interposer. Alternatively, the package substrate 500 may be a semiconductor chip including a semiconductor element. The package substrate 500 may function as a support substrate for a semiconductor package. For example, the first to fourth semiconductor chips 100 to 400 described above may be stacked on the package substrate 500.

The package substrate 500 may include a substrate body 510, a lower pad 520, and a package bonding pad 560. The lower pad 520 may be disposed on a lower face of the substrate body 510. The package bonding pad 560 may be disposed on an upper face of the substrate body 510. The package bonding pad 560 may be disposed inside the upper passivation layer 511. The upper passivation layer 511 may be disposed on the upper face of the substrate body 510.

An external connecting terminal 540 may be disposed below the package substrate 500. The external connecting terminal 540 may be disposed on the lower pad 520. For example, the external connecting terminal 540 may be a solder ball or a bump.

The bonding insulation films 610, 620, and 630 may be disposed between the first to fourth semiconductor chips 100 to 400. The bonding insulation films 610, 620, and 630 may include, for example, silicon oxide. The side faces of the bonding insulation films 610, 620, and 630 may be disposed on the same plane as the side faces of the first to fourth semiconductor chips 100 to 400. That is, in the first direction X, the widths of the bonding insulation films 610, 620, and 630 may be equal to the widths of the first to fourth semiconductor chips 100 to 400.

The first bonding insulation film 610 may fill the space between the first semiconductor chip 100 and the second semiconductor chip 200. The first bonding insulation film 610 may surround the first front bonding pad 160 and the second back bonding pad 250 disposed between the first semiconductor chip 100 and the second semiconductor chip 200.

The second bonding insulation film 620 may fill the space between the second semiconductor chip 200 and the third semiconductor chip 300. The second bonding insulation film 620 may surround the second front bonding pad 260 and the third back bonding pad 350, which are disposed between the second semiconductor chip 200 and the third semiconductor chip 300.

The third bonding insulation film 630 may fill the space between the third semiconductor chip 300 and the fourth semiconductor chip 400. The third bonding insulation film 630 may surround the third front bonding pad 360 and the fourth back bonding pad 450, which are disposed between the third semiconductor chip 300 and the fourth semiconductor chip 400.

The molding film 700 may be formed on the package substrate 500. The molding film 700 may cover the first to fourth semiconductor chips 100 to 400. The molding film 700 may include, for example, a polymer such as resin. For example, the molding film 700 may include, but not limited to, EMC (Epoxy Molding Compound).

FIGS. 3 to 7 are diagrams illustrating another example of a semiconductor package. For convenience of explanation, the explanation will focus on points that are different from those explained with reference to FIGS. 1 and 2.

Figure 3:
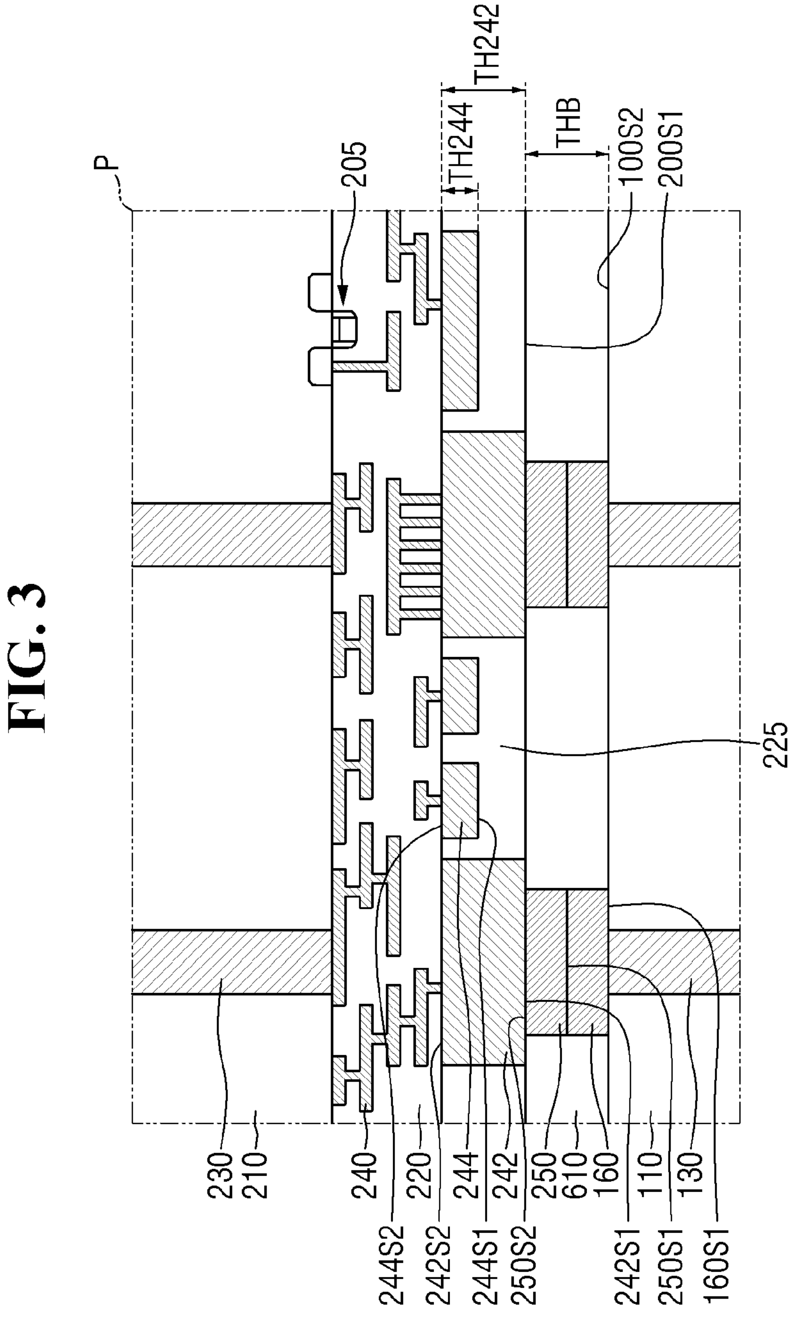

Referring to FIG. 3, the bonding thickness THB and the thickness TH242 of the second connection wiring pad may be the same. The thickness between the first surface 160S1 of the first front bonding pad and the second surface 250S2 of the second back bonding pad may be the same as the thickness TH242 of the second connection wiring pad.

Figure 4:
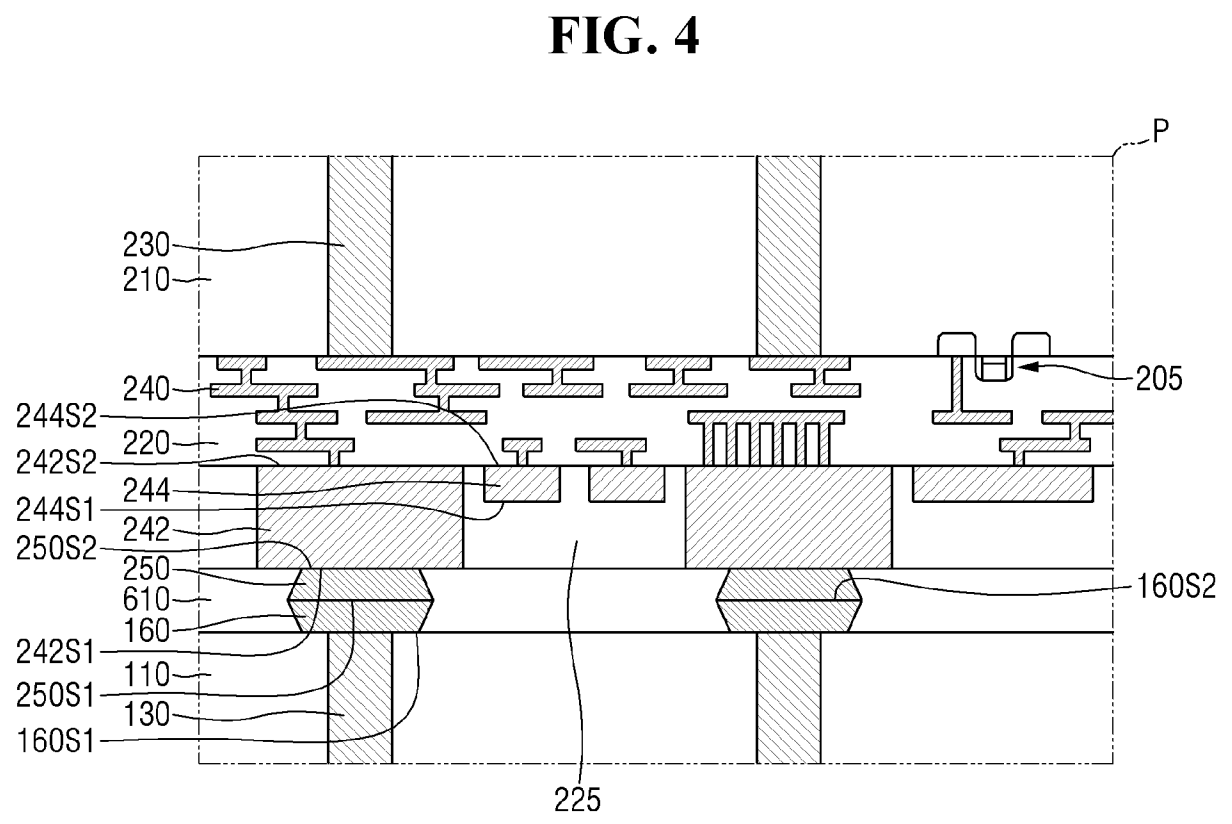

Referring to FIG. 4, the width of the first front bonding pad 160 may not be constant. For example, the first front bonding pad 160 may have a reversed trapezoidal cross-section. The width of the first surface 160S1 of the first front bonding pad may be smaller than the width of the second surface 160S2 of the first front bonding pad. That is, the width of the first front bonding pad 160 may increase from the first semiconductor chip 100 toward the second semiconductor chip 200.

The width of the second back bonding pad 250 may not be constant. For example, the second back bonding pad 250 may have a trapezoidal cross-section. The width of the first surface 250S1 of the second back bonding pad may be greater than the width of the second surface 250S2 of the second back bonding pad. That is, the width of the second back bonding pad 250 may decrease from the first semiconductor chip 100 toward the second semiconductor chip 200.

The second surface 160S2 of the first front bonding pad and the first surface 250S1 of the second back bonding pad may have the same width. The first surface 160S1 of the first front bonding pad and the second surface 250S2 of the second back bonding pad may have the same width.

Figure 5:
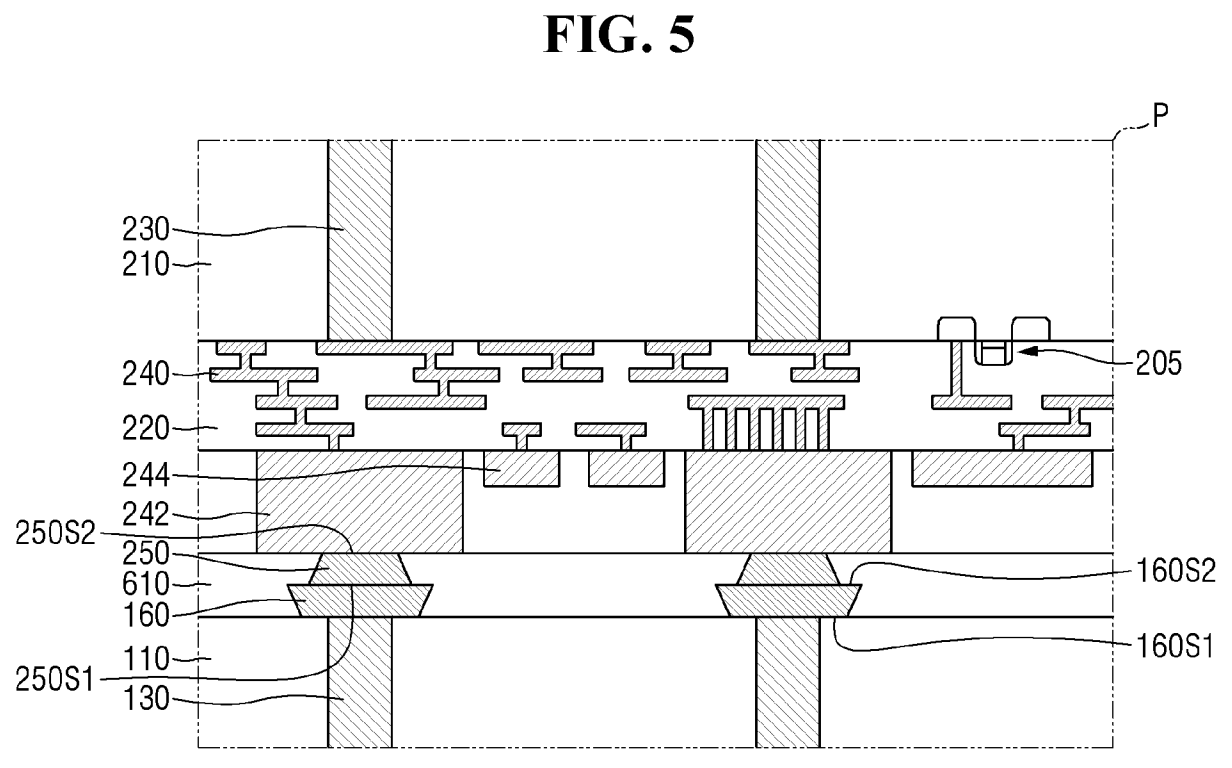

Referring to FIG. 5, the second surface 160S2 of the first front bonding pad and the first surface 250S1 of the second back bonding pad may not have the same width. For example, the width of the second surface 160S2 of the first front bonding pad may be greater than the width of the first surface 250S1 of the second back bonding pad.

The first surface 160S1 of the first front bonding pad and the second surface 250S2 of the second back bonding pad may not have the same width. For example, the width of the first surface 160S1 of the first front bonding pad may be greater than the width of the second surface 250S2 of the second back bonding pad.

Figure 6:
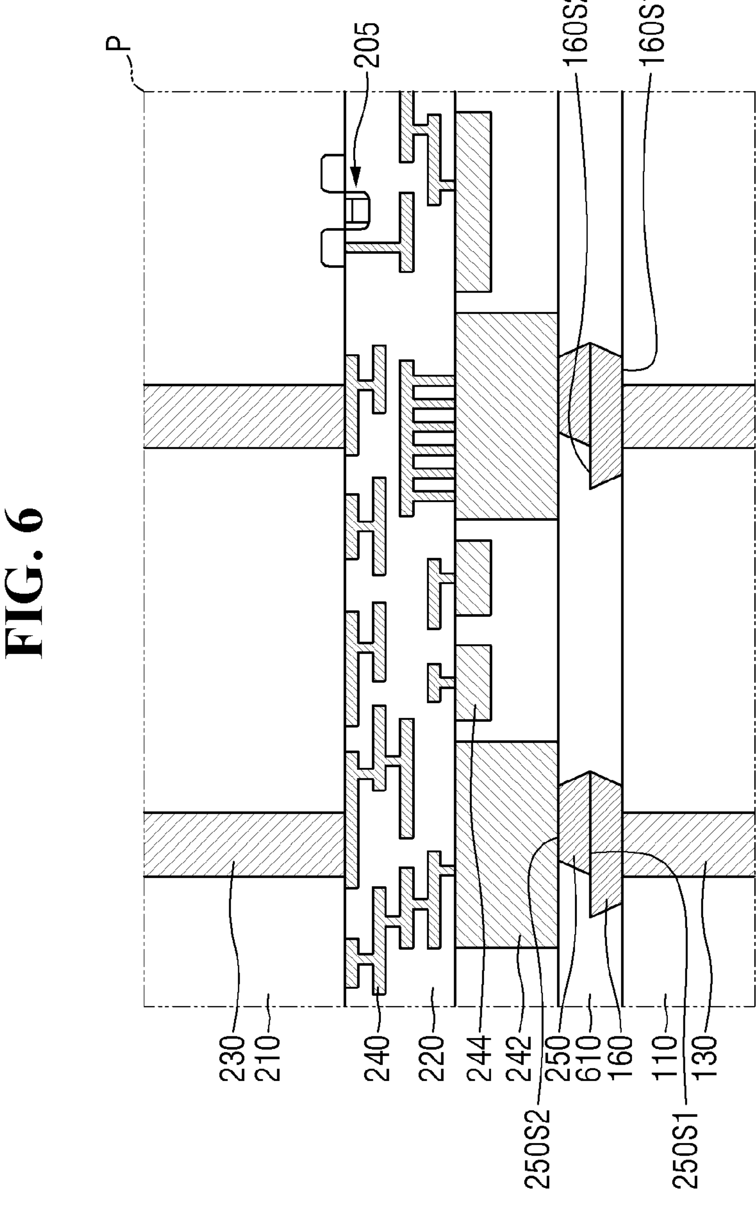

Referring to FIG. 6, the first front bonding pads 160 and the second back bonding pads 250 may be alternately disposed. For example, the center of the first front bonding pad 160 and the center of the second back bonding pad 250 may not coincide with each other, but may be shifted from each other.

Figure 7:
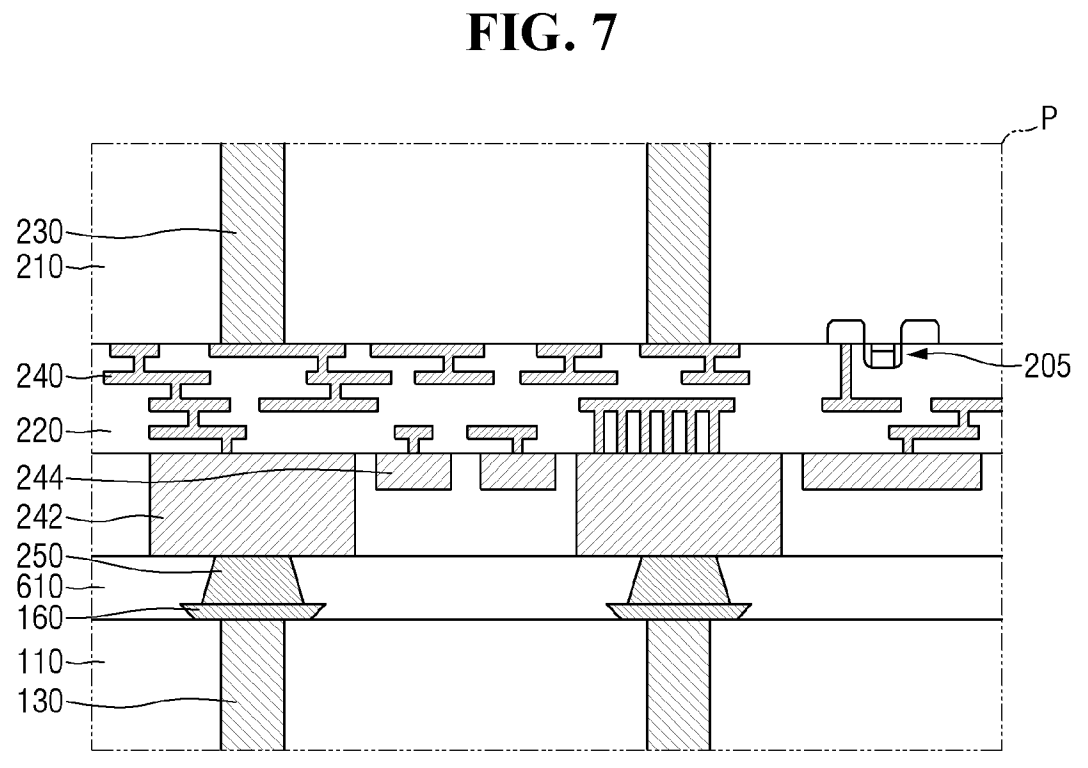

Referring to FIG. 7, the thickness of the first front bonding pad 160 may not be equal to the thickness of the second back bonding pad 250. The thickness of the first front bonding pad 160 may be smaller than the thickness of the second back bonding pad 250. Although FIG. 7 only shows that the thickness of the first front bonding pad 160 is smaller than the thickness of the second back bonding pad 250, the implementations are not limited thereto. For example, the thickness of the first front bonding pad 160 may be greater than the thickness of the second back bonding pad 250.

Figure 8:
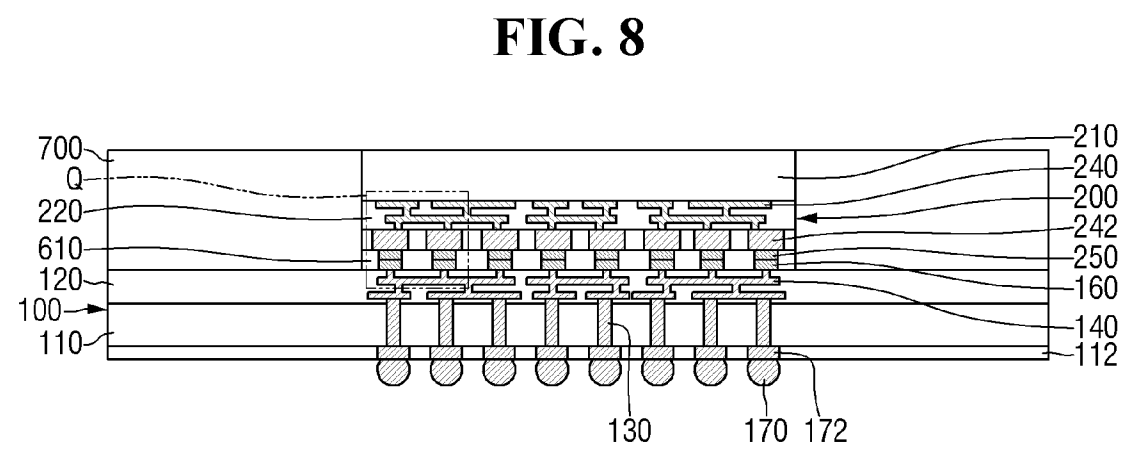
Figure 9:
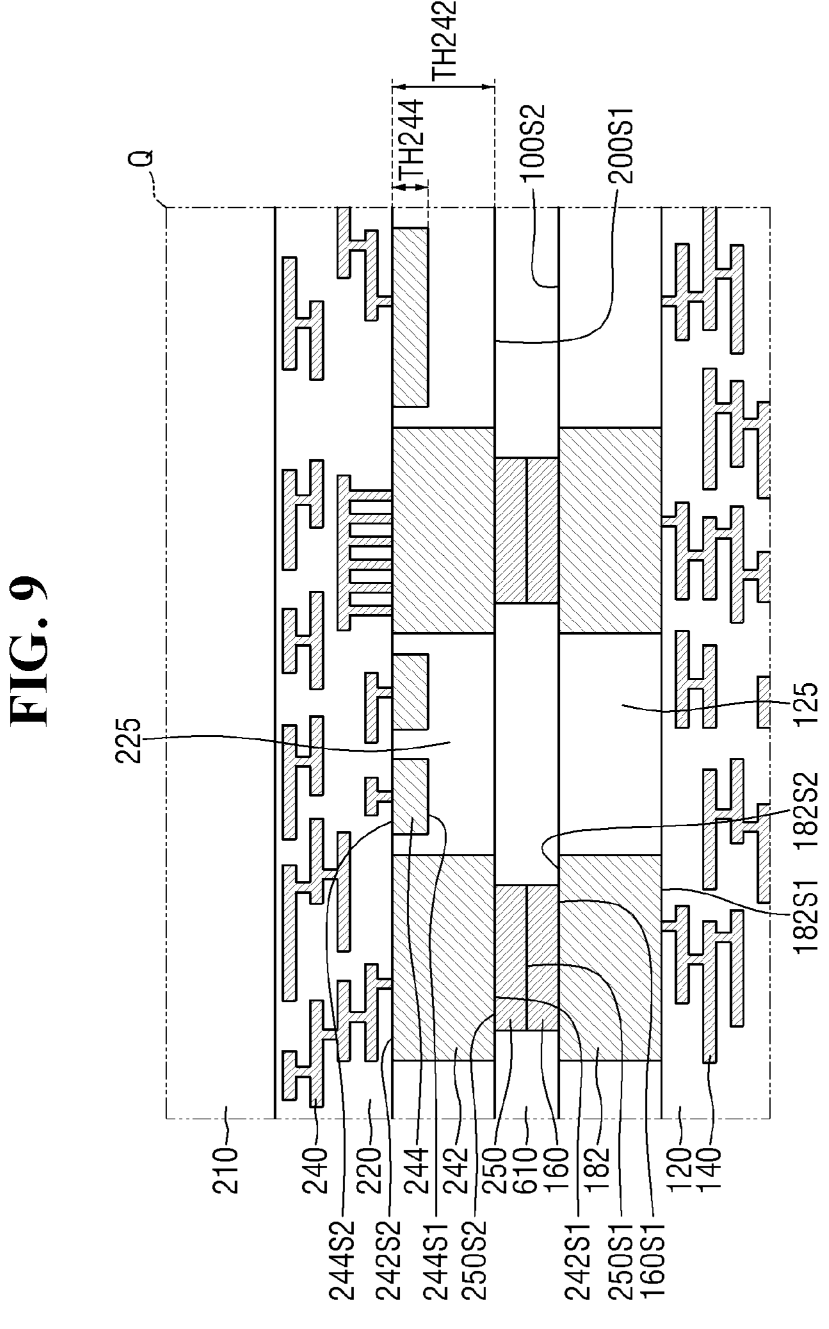
FIG. 9 is an example enlarged view showing a portion Q of FIG. 8.

FIG. 8 is a diagram illustrating another example of a semiconductor package. FIG. 9 is an example enlarged view showing a portion Q of FIG. 8. For convenience of explanation, the explanation will focus on points that are different from those explained with reference to FIGS. 1 and 2.

Referring to FIGS. 8 and 9, a semiconductor package includes a first semiconductor chip 100, a second semiconductor chip 200, and a molding film 700.

The second semiconductor chip 200 may be disposed on the first semiconductor chip 100. The width of the second semiconductor chip 200 may be smaller than the width of the first semiconductor chip 100. The side face of the second semiconductor chip 200 may not be disposed on the same plane as the side face of the first semiconductor chip 100. The molding film 700 may cover the second semiconductor chip 200. The molding film 700 may cover a side face of the second semiconductor chip 200.

The first semiconductor element layer 120 may be disposed on the upper face of the first semiconductor substrate 110. The first semiconductor element layer 120 may include a fifth connection wiring pad 182. The fifth connection wiring pad 182 may be disposed inside the first semiconductor element layer 120.

The first front bonding pad 160 may be disposed on the first semiconductor element layer 120. The first front bonding pad 160 may be electrically connected to the first wiring structure 140.

The first front bonding pad 160 may be disposed on the fifth connection wiring pad 182. The first front bonding pad 160 may be in contact with the fifth connection wiring pad 182.

The fifth connection wiring pad 182 may be connected to the first wiring structure 140 and the first front bonding pad 160. The fifth connection wiring pad 182 may be in contact with the first wiring structure 140 and the first front bonding pad 160. The first surface 182S1 of the fifth connection wiring pad may be in contact with the first wiring structure 140. The fifth connection wiring pad 182 may electrically connect the first wiring structure 140 to the first front bonding pad 160. The second surface 182S2 of the fifth connection wiring pad may be in contact with the first surface 160S1 of the first front bonding pad.

The fifth connection wiring pad 182 may be surrounded by the first insulating film 125 inside the first semiconductor element layer 120. The side face of the fifth connection wiring pad 182 may be surrounded by the first insulating film 125 inside the first semiconductor element layer 120. The first surface 182S1 and the second surface 182S2 of the fifth connection wiring pad 182 may not be covered with the first insulating film 125. The first surface 182S1 and the second surface 182S2 of the fifth connection wiring pad 182 may not overlap the first insulating film 125. The fifth connection wiring pad 182 may include aluminum.

The first front bonding pad 160 may be disposed between the fifth connection wiring pad 182 and the first back bonding pad 250. The first back bonding pad 250 may be disposed between the first front bonding pad 160 and the second connection wiring pad 242.

Figure 10:
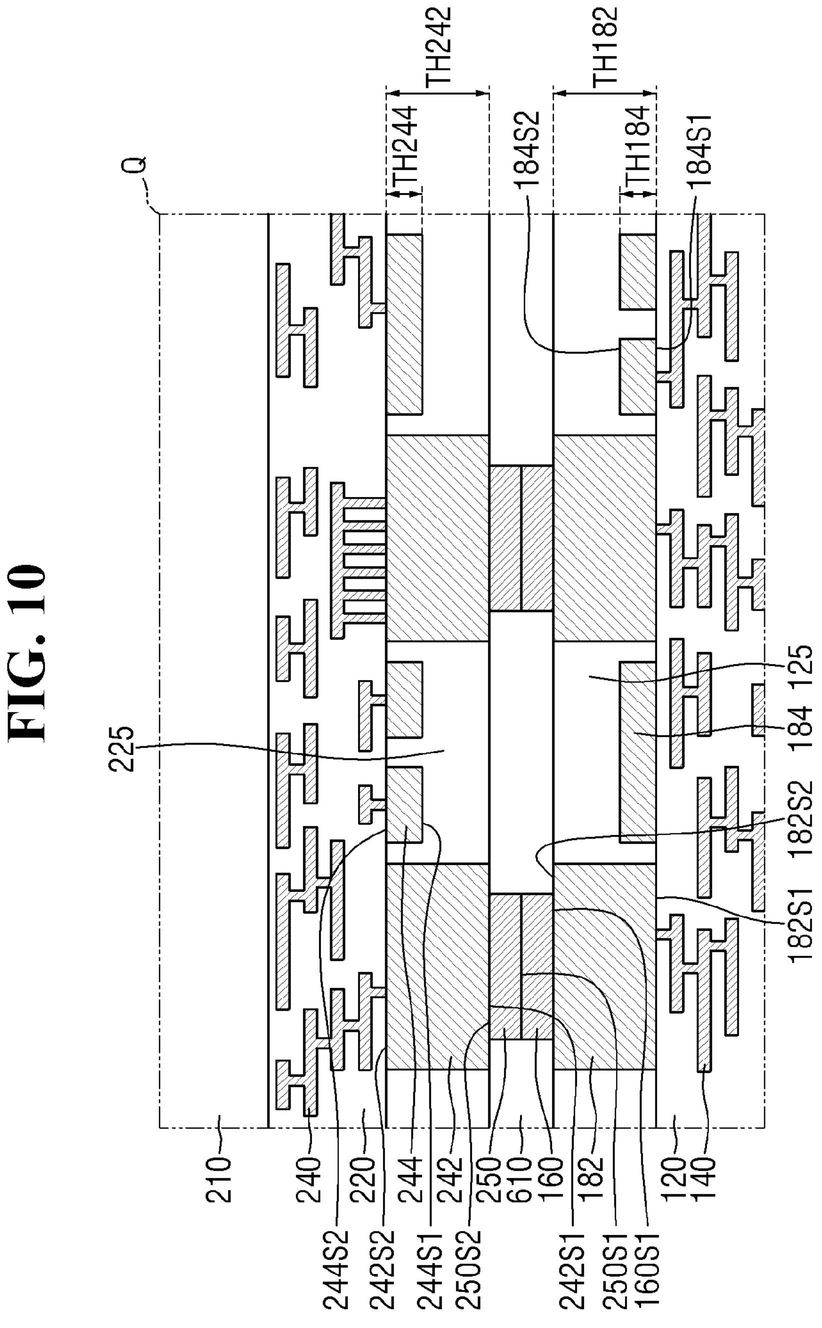
FIG. 10 is a diagram illustrating another example of a semiconductor package.

FIG. 10 is a diagram illustrating another example of a semiconductor package. For convenience of explanation, points different from those described with reference to FIGS. 8 and 9 will be mainly explained.

Referring to FIG. 10, the first semiconductor chip 100 may include a fifth peripheral wiring pad 184. The fifth peripheral wiring pad 184 may be spaced apart from the fifth connection wiring pad 182. For example, the fifth peripheral wiring pad 184 may be spaced apart from the fifth connection wiring pad 182 in the first direction X.

The fifth peripheral wiring pad 184 may not be in contact with the first front bonding pad 160. The fifth peripheral wiring pad 184 may be spaced apart from the first front bonding pad 160. The first front bonding pad 160 may not be disposed on the fifth peripheral wiring pad 184.

The fifth connection wiring pad 182 and the fifth peripheral wiring pad 184 may have different thicknesses from each other. A thickness TH182 of the fifth connection wiring pad may be greater than a thickness TH184 of the fifth peripheral wiring pad. The thickness TH184 of the fifth peripheral wiring pad may be, for example, 50% or less of the thickness TH182 of the fifth connection wiring pad.

The first surface 182S1 of the fifth connection wiring pad and the first surface 184S1 of the fifth peripheral wiring pad may be disposed on the same plane.

The first surface 182S1 of the fifth connection wiring pad may be a face on which the first wiring structure 140 is in contact with the fifth connection wiring pad 182. The first surface 184S1 of the fifth peripheral wiring pad may be a face on which the first wiring structure 140 is in contact with the fifth peripheral wiring pad 184.

The second surface 182S2 of the fifth connection wiring pad and the second surface 184S2 of the fifth peripheral wiring pad may not be disposed on the same plane. For example, on the basis of the second surface 100S2 of the first semiconductor chip, the second surface 182S2 of the fifth connection wiring pad may be disposed above the second surface 184S2 of the fifth peripheral wiring pad. The second surface 182S2 of the fifth connection wiring pad and the second surface 184S2 of the fifth peripheral wiring pad may have a level difference.

The second surface 182S2 of the fifth connection wiring pad may be a face that is opposite to the first surface 182S1 of the fifth connection wiring pad. The second surface 182S2 of the fifth connection wiring pad may be a face that is in contact with the first front bonding pad 160. The second surface 182S2 of the fifth connection wiring pad may face the second semiconductor chip 200.

The second surface 184S2 of the fifth peripheral wiring pad may be a face that is opposite to the first surface 184S1 of the fifth peripheral wiring pad. The second surface 184S2 of the fifth peripheral wiring pad may face the second semiconductor chip 200. The second surface 184S2 of the fifth peripheral wiring pad may be covered with the first insulating film 125 inside the first semiconductor element layer 120.

In FIG. 10, although the thickness TH182 of the fifth connection wiring pad is shown as being equal to the thickness TH242 of the second connection wiring pad, the implementation is not limited thereto. For example, the thickness TH182 of the fifth connection wiring pad may be smaller than the thickness TH242 of the second connection wiring pad. In FIG. 10, although the thickness TH184 of the fifth peripheral wiring pad is shown as being equal to the thickness TH244 of the second peripheral wiring pad, the implementation is not limited thereto. For example, the thickness TH184 of the fifth peripheral wiring pad may be smaller than the thickness TH244 of the second peripheral wiring pad.

Figure 11:
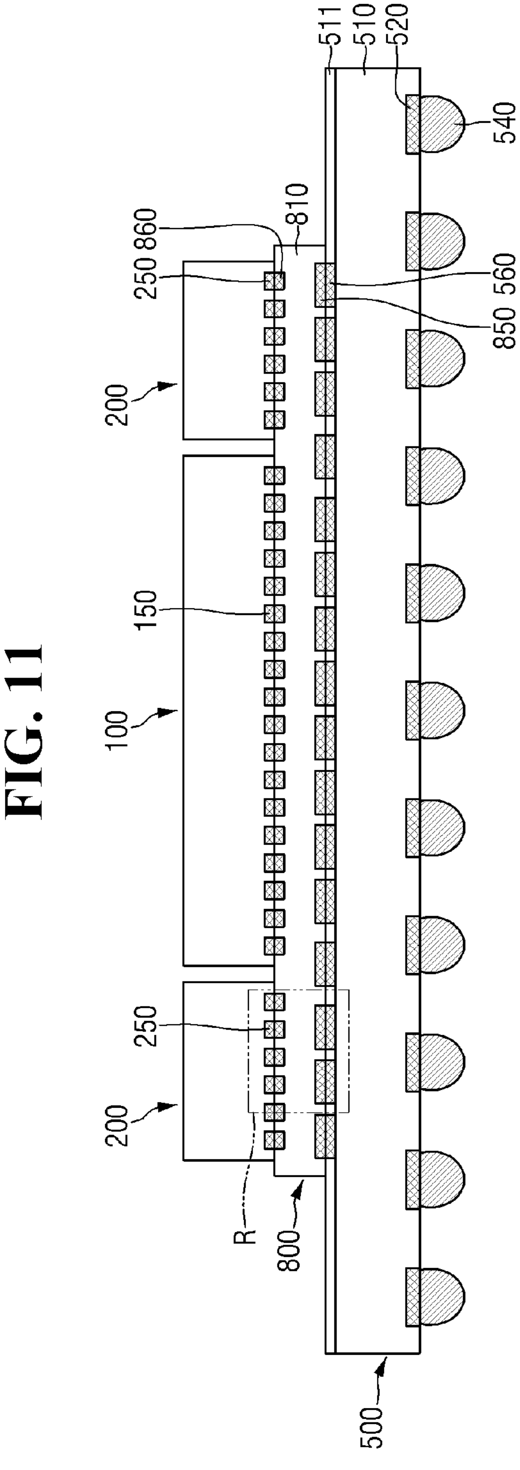
FIG. 11 is a diagram illustrating another example of a semiconductor package.
Figure 12:
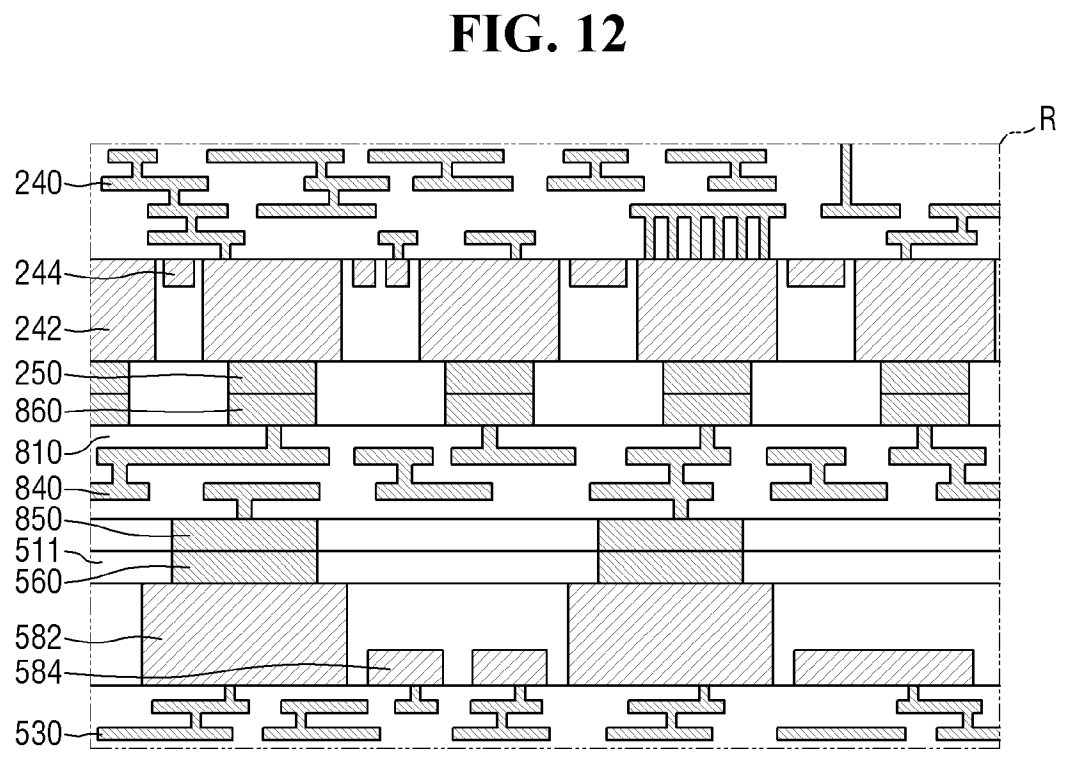

FIG. 11 is a diagram illustrating another example of a semiconductor package. FIG. 12 is an example enlarged view showing a portion R of FIG. 11. For convenience of explanation, the explanation will focus on points that are different from those explained with reference to FIGS. 1 and 2.

Referring to FIGS. 11 and 12, the semiconductor package includes a package substrate 500, a first semiconductor chip 100, a second semiconductor chip 200, and an interposer 800.

The package substrate 500 may be mounted on a motherboard of an electronic device or the like. For example, the package substrate 500 may be mounted on a motherboard or the like of an electronic device through the external connecting terminal 540. The package substrate 500 may be, but not limited to, a ball grid array (BGA) substrate.

The external connecting terminal 540 may be, for example, but not limited to, a solder bump. The external connecting terminal 540 may have various shapes such as a land, a ball, a pin, and a pillar. Of course, the number, spacing, placement form, and the like of the external connecting terminals 540 are not limited to those shown in the drawings, and may vary depending on the design.

The interposer 800 may be disposed on the upper face of the package substrate 500. The interposer 800 may be, but not limited to, a silicon interposer or an organic interposer. The interposer 800 may include a lower face and an upper face that are opposite to each other. The lower face of the interposer 800 may face an upper face of the package substrate 500. The interposer 800 may be used to facilitate the connection between the package substrate 500, the first semiconductor chip 100, and the second semiconductor chip 200, and alleviate warpage of the semiconductor package.

The interposer 800 may include an interposer substrate 810, an interposer back bonding pad 850, and an interposer front bonding pad 860. The interposer back bonding pad 850 and the interposer front bonding pad 860 may each be used to electrically connect the interposer 800 to other constituent elements. For example, the interposer back bonding pad 850 may be exposed from the lower face of the interposer substrate 810. The interposer front bonding pad 860 may be exposed from the upper face of the interposer substrate 810. The interposer back bonding pad 850 and the interposer front bonding pad 860 may include, but not limited to, metallic materials such as copper (Cu) or aluminum (Al).

The interposer back bonding pad 850 may be in contact with the package the bonding pad 560. The interposer back bonding pad 850 may be directly bonded to the package bonding pad 560. The interposer back bonding pad 850 may be electrically connected to the package bonding pad 560. The interposer back bonding pad 850 and the package bonding pad 560 may be bonded to electrically connect the interposer 800 and the package substrate 500.

The interposer front bonding pad 860 may be in contact with the first back bonding pad 150 and the second back bonding pad 250. The interposer front bonding pad 860 may be directly bonded to the first back bonding pad 150 and the second back bonding pad 250. The interposer front bonding pad 860 may be electrically connected to the first back bonding pad 150 and the second back bonding pad 250. The first semiconductor chip 100 and the interposer 800 may be electrically connected by bonding the interposer front bonding pad 860 and the first back bonding pad 150. The second semiconductor chip 200 and the interposer 800 may be electrically connected by bonding the interposer front bonding pad 860 and the second back bonding pad 250.

The first semiconductor chip 100 and the second semiconductor chip 200 may be mounted on the upper face of the interposer 800. The first semiconductor chip 100 and the second semiconductor chip 200 may be spaced apart from each other, and disposed on the upper face of the interposer 800. The first semiconductor chip 100 and the second semiconductor chip 200 may each be an integrated circuit (IC) in which hundreds to millions of or more semiconductor elements are integrated in a single chip.

In some implementations, first semiconductor chip 100 may be a logic semiconductor chip. For example, the first semiconductor chip 100 may be, but not limited to, an application processor (AP), such as a CPU (Central Processing Unit), a GPU (Graphic Processing Unit), an FPGA (Field-Programmable Gate Array), a digital signal processor, an encryption processor, a micro processor, a micro controller, and an ASIC (Application-Specific IC).

In some implementations, the second semiconductor chip 200 may be a memory semiconductor chip. For example, the second semiconductor chip 200 may be a volatile memory such as a DRAM (dynamic random access memory) or a SRAM (static random access memory), or a non-volatile memory such as a flash memory, a PRAM (phase-change random access memory), a MRAM (Magnetoresistive Random Access Memory), a FeRAM (Ferroelectric Random Access Memory) or a RRAM (Resistive Random Access Memory).

As an example, the first semiconductor chip 100 may be an ASIC such as a GPU, and the second semiconductor chip 200 may be a stack memory, such as a high bandwidth memory (HBM). Such a stack memory may have a form in which a plurality of integrated circuits are stacked. The stacked integrated circuits may be electrically connected to each other through a TSV (Through Silicon Via) or the like.

In some implementations, the second semiconductor chips 200 may be disposed in the larger numbers than the first semiconductor chips 100. For example, a plurality of second semiconductor chips 200 may be disposed around the first semiconductor chip 100. For example, two second semiconductor chips 200 may be disposed on each side of the first semiconductor chip 100.

The first semiconductor chip 100 may include a first back bonding pad 150. The first back bonding pad 150 may be used to electrically connect the first semiconductor chip 100 to other constituent elements. For example, the first back bonding pad 150 may be exposed from the lower face of the first semiconductor chip 100.

The first back bonding pad 150 may be in contact with the interposer front bonding pad 860. The first back bonding pad 150 may be disposed on the interposer front bonding pad 860. The first back bonding pad 150 may be bonded to the interposer front bonding pad 860. Accordingly, the first semiconductor chip 100 may be electrically connected to the interposer 800.

The second semiconductor chip 200 may include a second back bonding pad 250. The second back bonding pad 250 may be used to electrically connect the second semiconductor chip 200 to other constituent elements. For example, the second back bonding pad 250 may be exposed from the lower face of the second semiconductor chip 200.

The second back bonding pad 250 may be in contact with the interposer front bonding pad 860. The second back bonding pad 250 may be disposed on the interposer front bonding pad 860. The second back bonding pad 250 may be bonded to the interposer front bonding pad 860. The second semiconductor chip 200 may be electrically connected to the interposer 800 accordingly.

The first back bonding pad 150 and the second back bonding pad 250 may each include a metal material such as, but not limited to, copper (Cu) or aluminum (Al). In some implementations, the first back bonding pad 150 and the second back bonding pad 250 may each include copper (Cu).

The package substrate 500 may include a sixth connection wiring pad 582 and a sixth peripheral wiring pad 584. The sixth connection wiring pad 582 and the sixth peripheral wiring pad 584 may be connected to the package substrate wiring 530. The sixth connection wiring pad 582 and the sixth peripheral wiring pad 584 may be spaced apart from each other.

The sixth connection wiring pad 582 may be connected to the package bonding pad 560. The sixth connection wiring pad 582 may be in contact with the package bonding pad 560. The sixth connection wiring pad 582 may be disposed on the package bonding pad 560. The upper face of the sixth connection wiring pad 582 may be in contact with the lower face of the package bonding pad 560. The sixth connection wiring pad 582 may electrically connect the package substrate wiring 530 and the package bonding pad 560.

The sixth peripheral wiring pad 584 may not be connected to the package bonding pad 560. The sixth peripheral wiring pad 584 may not be in contact with the package bonding pad 560. The upper face of the sixth peripheral wiring pad 584 may not be in contact with the lower face of the package bonding pad 560. The sixth peripheral wiring pad 584 may be spaced apart from the package bonding pad 560. An upper face of the sixth peripheral wiring pad 584 may be spaced apart from a lower face of the package bonding pad 560.

A thickness of the sixth connection wiring pad 582 may be greater than a thickness of the sixth peripheral wiring pad 584. The lower face of the sixth connection wiring pad 582 may be disposed on the same plane as the lower face of the sixth peripheral wiring pad 584. The upper face of the sixth connection wiring pad 582 may be disposed above the upper face of the sixth peripheral wiring pad 584 on the basis of the lower face of the package substrate 500. The upper face of the sixth connection wiring pad 582 and the upper face of the sixth peripheral wiring pad 584 may have a step difference.

Figure 13:
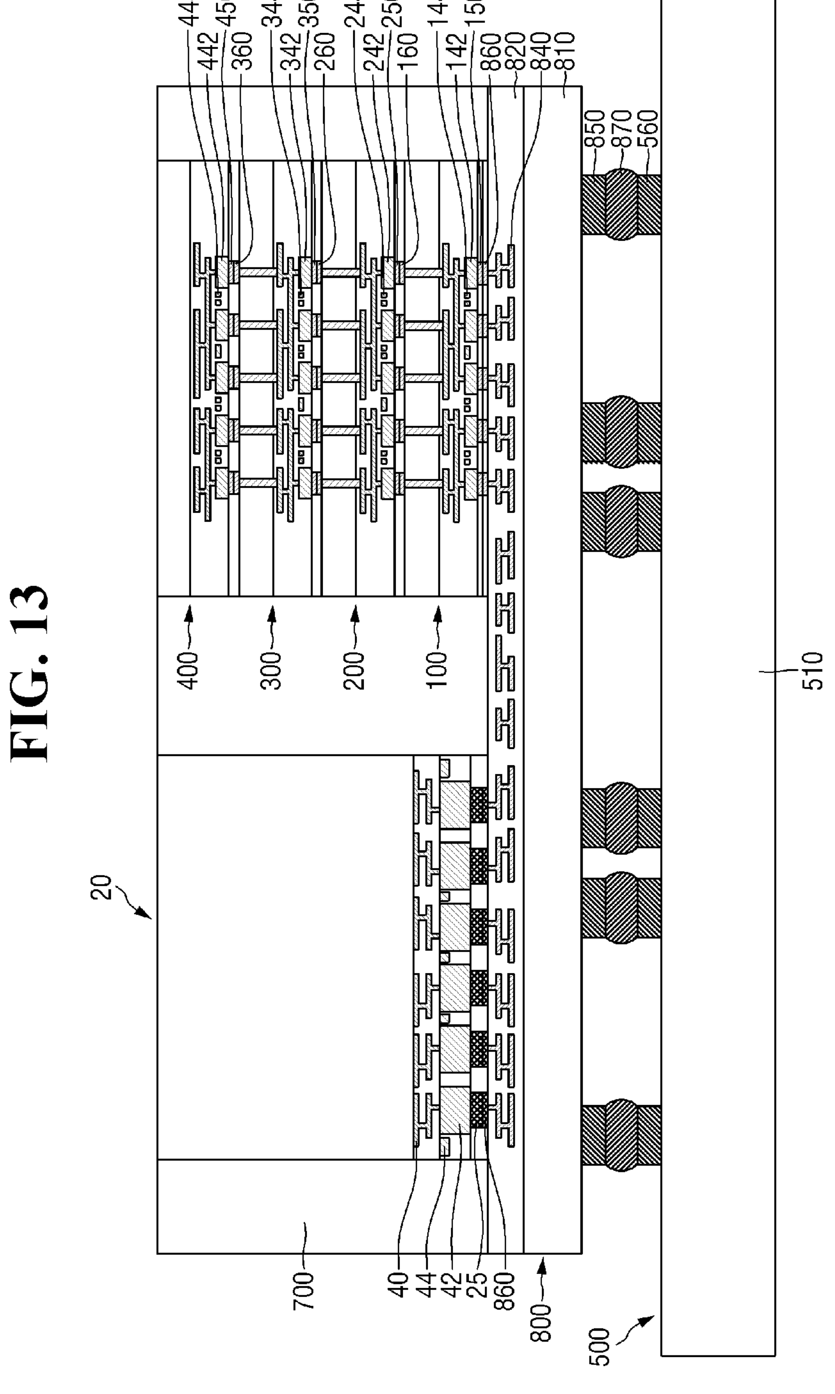
FIG. 13 is a diagram illustrating another example of a semiconductor package.

FIG. 13 is a diagram illustrating another example of a semiconductor package. For convenience of explanation, the explanation will focus on points that are different from those explained with reference to FIGS. 1 and 2.

Referring to FIG. 13, the semiconductor package includes a fifth semiconductor chip 20. The fifth semiconductor chip 20 may be spaced apart from the stacked first to fourth semiconductor chips 100 to 400. The fifth semiconductor chip 20 may be disposed on the interposer 800. The fifth semiconductor chip 20 may be spaced apart from the first to fourth semiconductor chips 100 to 400 stacked on the interposer 800. The fifth semiconductor chip 20 may be covered with a molding film 700. A side face of the fifth semiconductor chip 20 may be covered with the molding film 700.

The fifth semiconductor chip 20 may include a fifth back bonding pad 25, a seventh connection pad 42, and a seventh peripheral wiring pad 44.

The fifth back bonding pad 25 may be connected to the seventh connection wiring pad 42. The fifth back bonding pad 25 may be in contact with the seventh connection wiring pad 42. The fifth back bonding pad 25 may not be connected to the seventh peripheral wiring pad 44. The fifth back bonding pad 25 may not be in contact with the seventh peripheral wiring pad 44.

The fifth back bonding pad 25 may be in contact with the interposer front bonding pad 860. The fifth back bonding pad 25 may be bonded to the interposer front bonding pad 860. The fifth semiconductor chip 50 and the interposer 800 may be electrically connected by bonding the fifth back bonding pad 25 and the interposer front bonding pad 860.

The interposer front bonding pad 860 may be connected to the interposer wiring 840. The interposer front bonding pad 860 may be connected to the fifth back bonding pad 25 and the first back bonding pad 150. The interposer front bonding pad 860 may be in contact with the fifth back bonding pad 25 and the first back bonding pad 150.

A connecting bump 870 may be disposed between the interposer back bonding pad 850 and the package bonding pad 560. However, the implementations are not limited thereto. For example, the interposer back bonding pad 850 and the package bonding pad 560 may be in direct contact with each other.

FIGS. 14 to 27 are diagrams illustrating intermediate steps of an example of a method for fabricating a semiconductor package.

Figure 14:
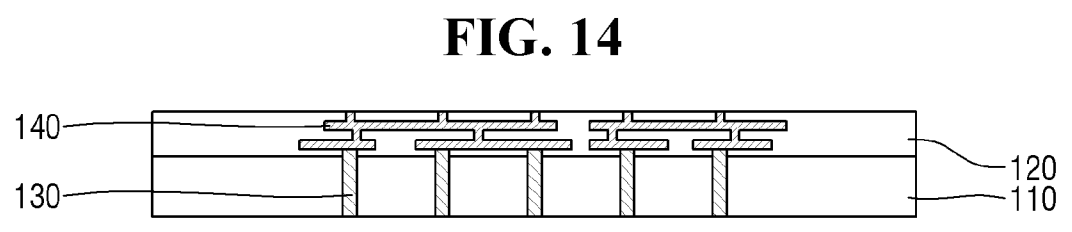

Referring to FIG. 14, the first semiconductor element layer 120 may be formed on the first semiconductor substrate 110.

The first through electrode 130 may be formed inside the first semiconductor substrate 110. The first wiring structure 140 connected to the first through electrode 130 may be formed inside the first semiconductor element layer 120.

Figure 15:
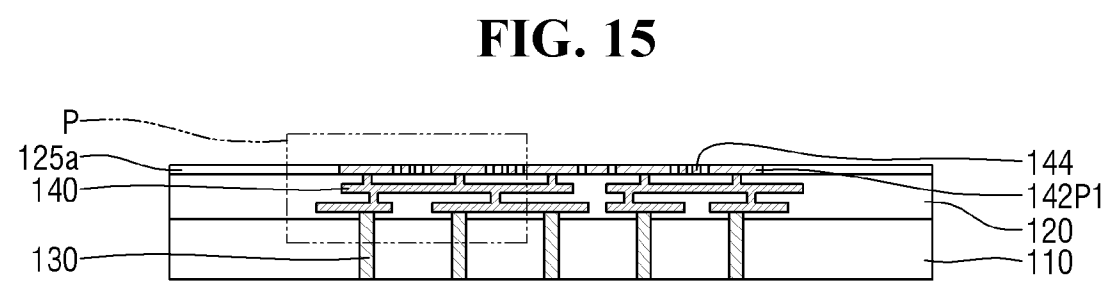
Figure 16:
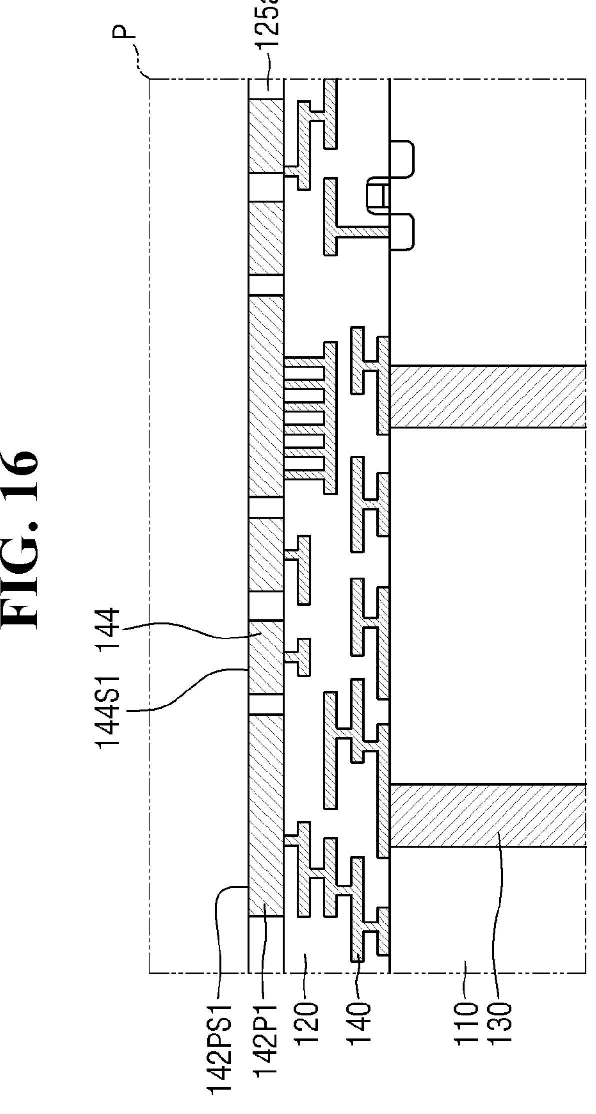

Referring to FIGS. 15 and 16, a first portion 142P1 of the first connection wiring pad and the first peripheral wiring pad 144 may be formed.

The first portion 142P1 of the first connection wiring pad and the first peripheral wiring pad 144 may be formed inside the first portion **125*a* of the first insulating film of the first semiconductor element layer 120. The first portion 125*a* of the first insulating film may be formed on the first wiring structure 140. The first portion 142P1 of the first connection wiring pad and the first peripheral wiring pad 144 may be connected to the first wiring structure 140**.

The first portion 142P1 of the first connection wiring pad and the first peripheral wiring pad 144 may have the same thickness. The first surface 142PS1 of the first portion of the first connection wiring pad and the first surface 144S1 of the first peripheral wiring pad may be disposed on the same plane.

Figure 17:
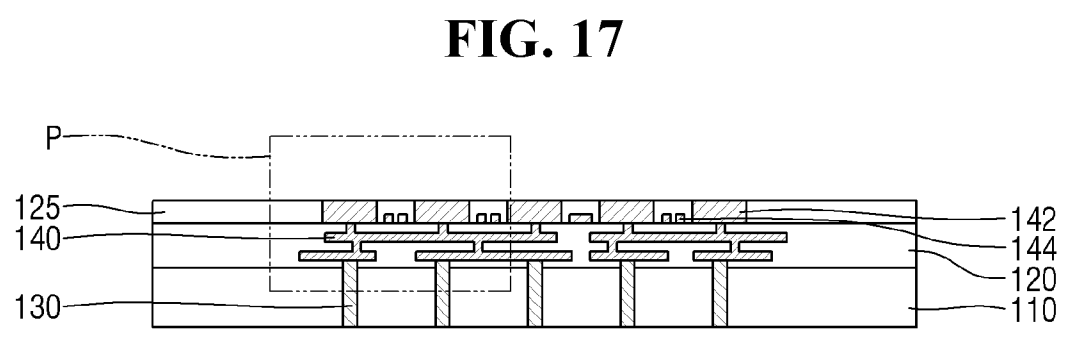

Referring to FIG. 17, the first connection wiring pad 142 may be formed inside the first insulating film 125.

Figure 18:
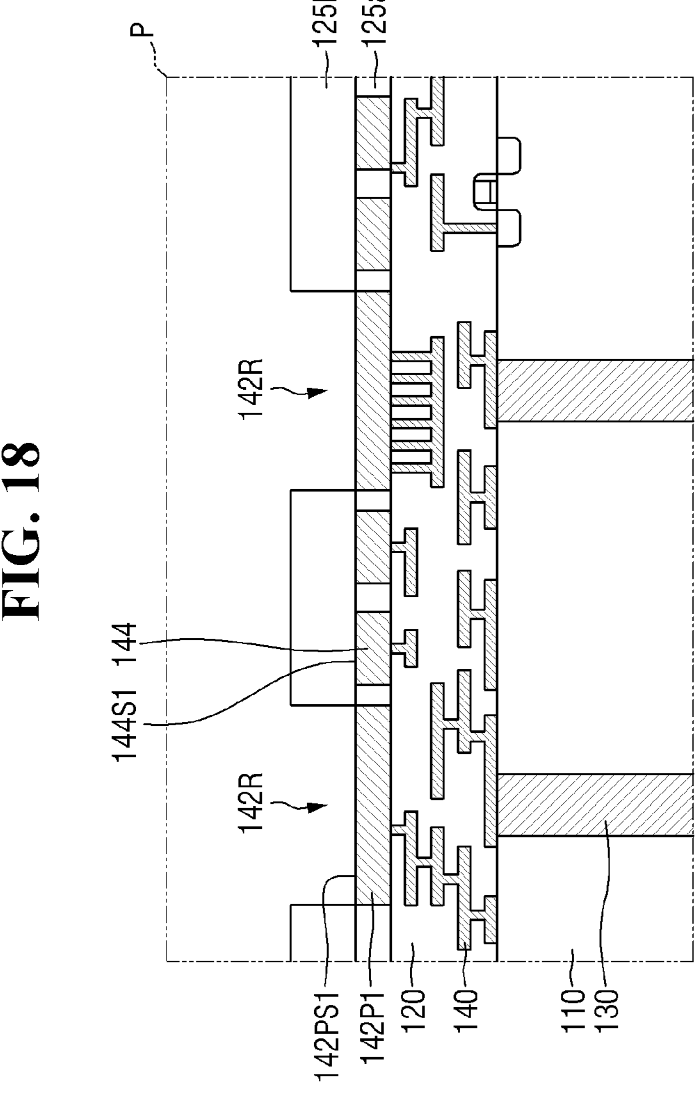

Specifically, referring to FIG. 18, a second portion **125*b* of the first insulating film may be formed on the first portion 142P1 of the first connection wiring pad and the first peripheral wiring pad 144. A first connection wiring pad recess 142R which penetrates the second portion 125*b* of the first insulating film and exposes the first portion 142P1 of the first connection wiring pad may be formed. The first surface 142PS1 of the first portion 142P1 of the first connection wiring pad may be exposed by the first connection wiring pad recess 142R. The first surface 144S1 of the first peripheral wiring pad may be covered with the second portion 125*b*** of the first insulating film.

Figure 19:
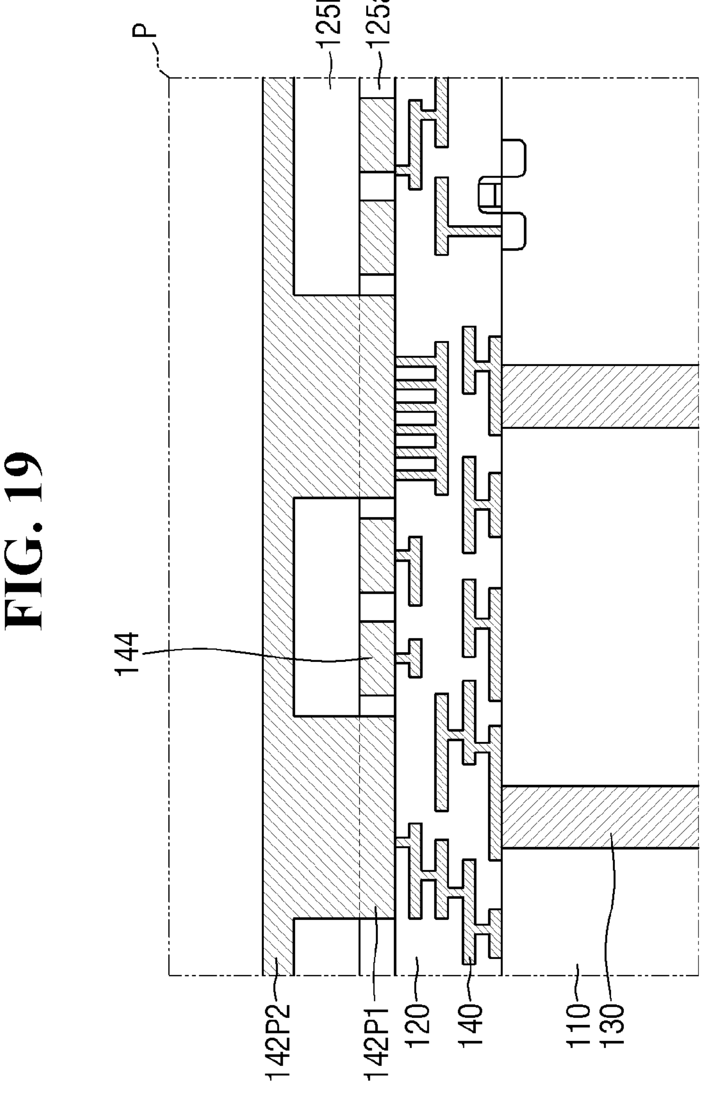

Next, referring to FIG. 19, a second portion 142P2 of the first connection wiring pad may be formed inside the first connection wiring pad recess (142R of FIG. 18). The second portion 142P2 of the first connection wiring pad may fill the first connection wiring pad recess (142R of FIG. 18).

The second portion 142P2 of the first connection wiring pad may be formed on the first portion 142P1 of the first connection wiring pad. The second portion 142P2 of the first connection wiring pad may cover the first surface (142PS1 of FIG. 18) of the first portion 142P1 of the first connection wiring pad.

Figure 20:
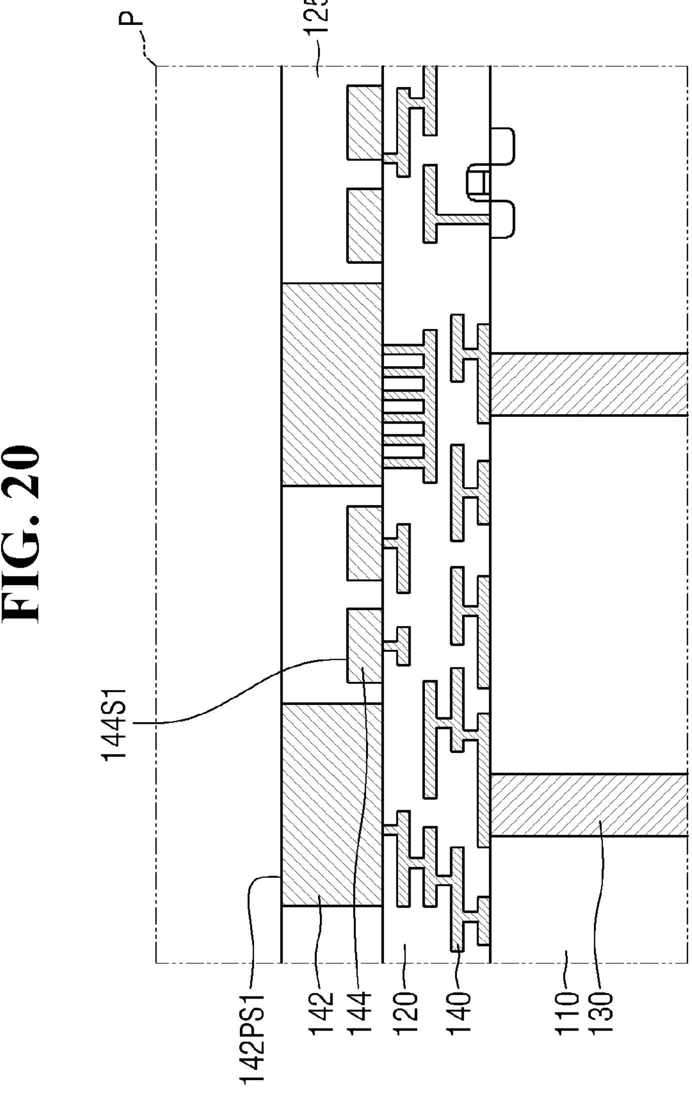

Subsequently, referring to FIG. 20, the second portion (142P2 of FIG. 19) of the first connection wiring pad that covers the upper face of the second portion (**125*b* of FIG. 19) of the first insulating film is removed, and the first connection wiring pad 142 and the first peripheral wiring pad 144** may be formed.

The first surface 142S1 of the first connection wiring pad may be exposed from the first insulating film 125. The first surface 144S1 of the first peripheral wiring pad may be covered with the first insulating film 125. The first insulating film 125 may include a first portion (**125*a* of FIG. 19) and a second portion (125*b* of FIG. 19**).

Figure 21:
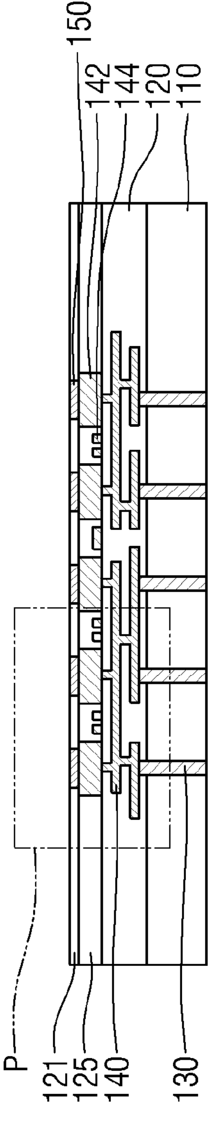
Figure 22:
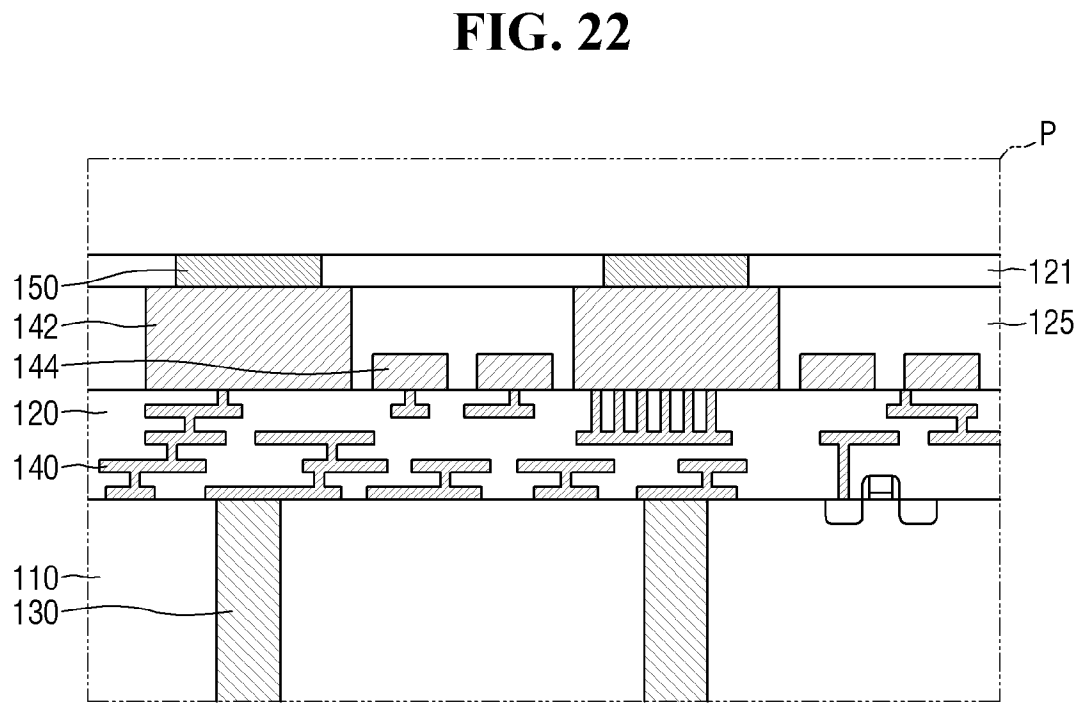

Referring to FIGS. 21 and 22, the first back bonding pad 150 may be formed.

The first back bonding pad 150 may be formed on the first connection wiring pad 142. The first back bonding pad 150 may be in contact with the first connection wiring pad 142.

The first passivation layer 121 may be formed on the first insulating film 125. The first passivation layer 121 may cover the first insulating film 125. The first back bonding pad 150 may be formed inside the first passivation layer 121.

Figure 23:
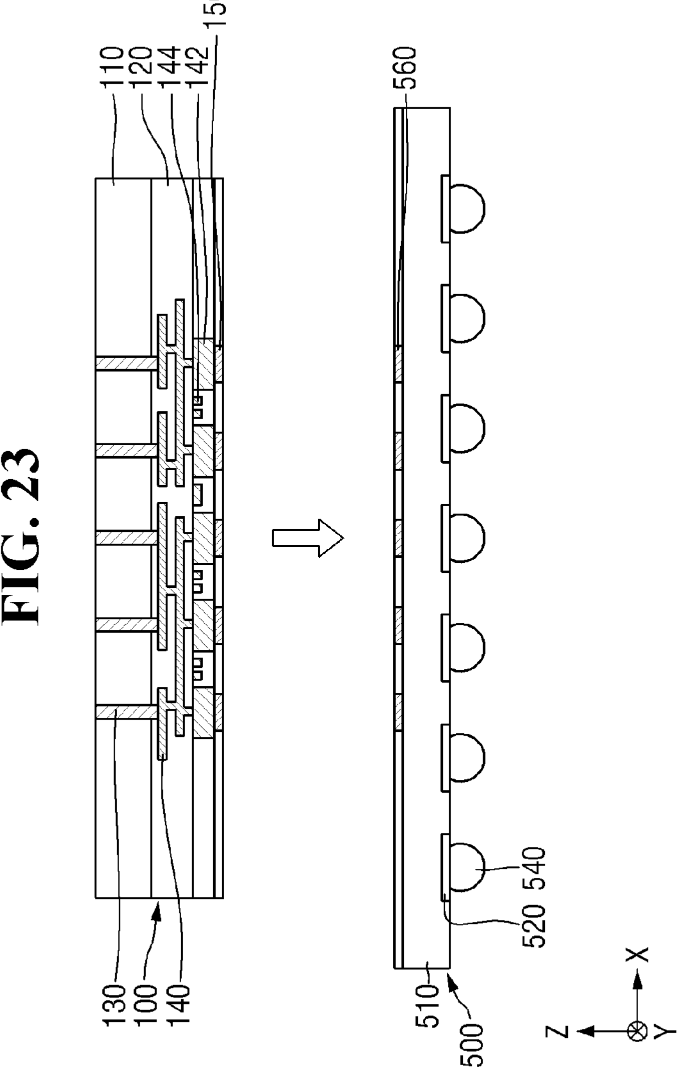
Figure 24:
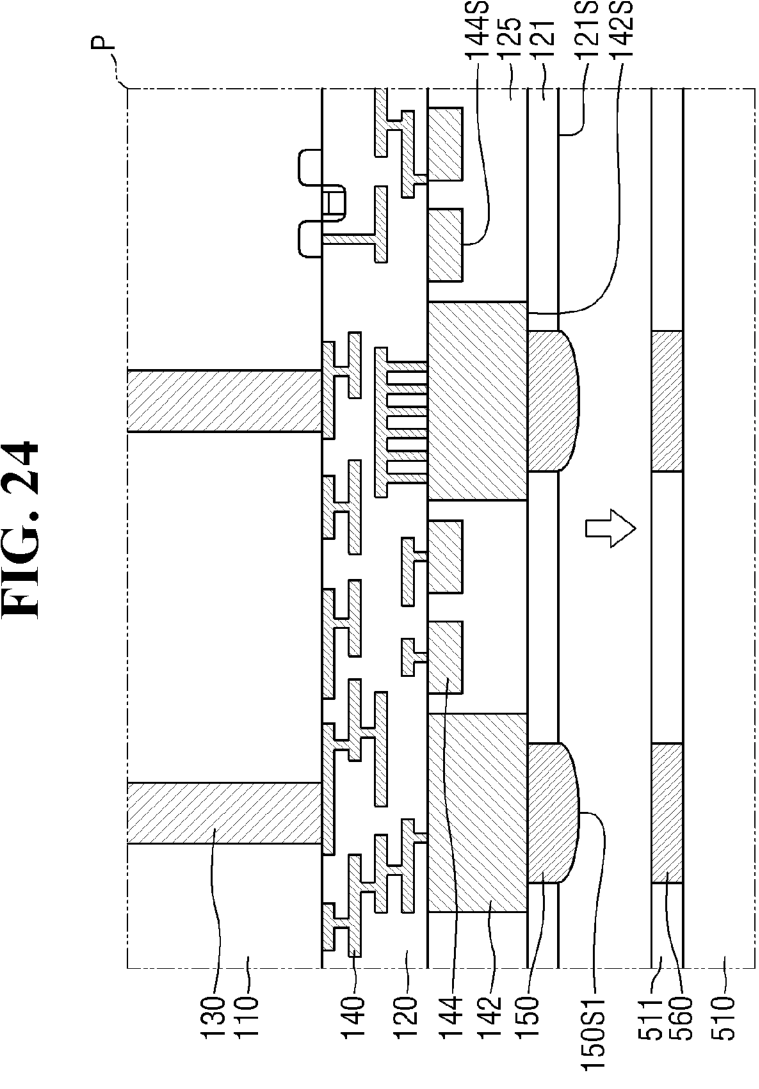

Referring to FIGS. 23 and 24, the first semiconductor chip 100 may be bonded onto the package substrate 500.

When the first semiconductor chip 100 is bonded onto the package substrate 500, an annealing process may be performed. For example, when the first semiconductor chip 100 is bonded onto the package substrate 500, heat may be applied. When annealed, the first back bonding pad 150 may expand. For example, the first surface 150S1 of the first back bonding pad may protrude beyond the first surface 121S1 of the first passivation layer.

The first back bonding pad 150 disposed on the first connection wiring pad 142 which is thicker than the first peripheral wiring pad 144 may protrude further than the first passivation layer 121. For example, the first connection wiring pad 142 may also expand due to annealing. Therefore, the first back bonding pad 150 disposed on the first connection wiring pad 142 may expand relatively further than the first passivation layer 121.

The first passivation layer 121 that covers the first peripheral wiring pad 144, which is thinner than the first connection wiring pad 142, may expand less than the first back bonding pad 150. For example, the first peripheral wiring pad 144 may also expand due to annealing, but the first passivation layer 121, which is not in direct contact with the first peripheral wiring pad 144 having a small thickness, may expand relatively less than the first back bonding pad 150. Since the first insulating film 125 is disposed on the first peripheral wiring pad 144, expansion of the first peripheral wiring pad 144 due to annealing may not affect the first passivation layer 121.

Figure 25:
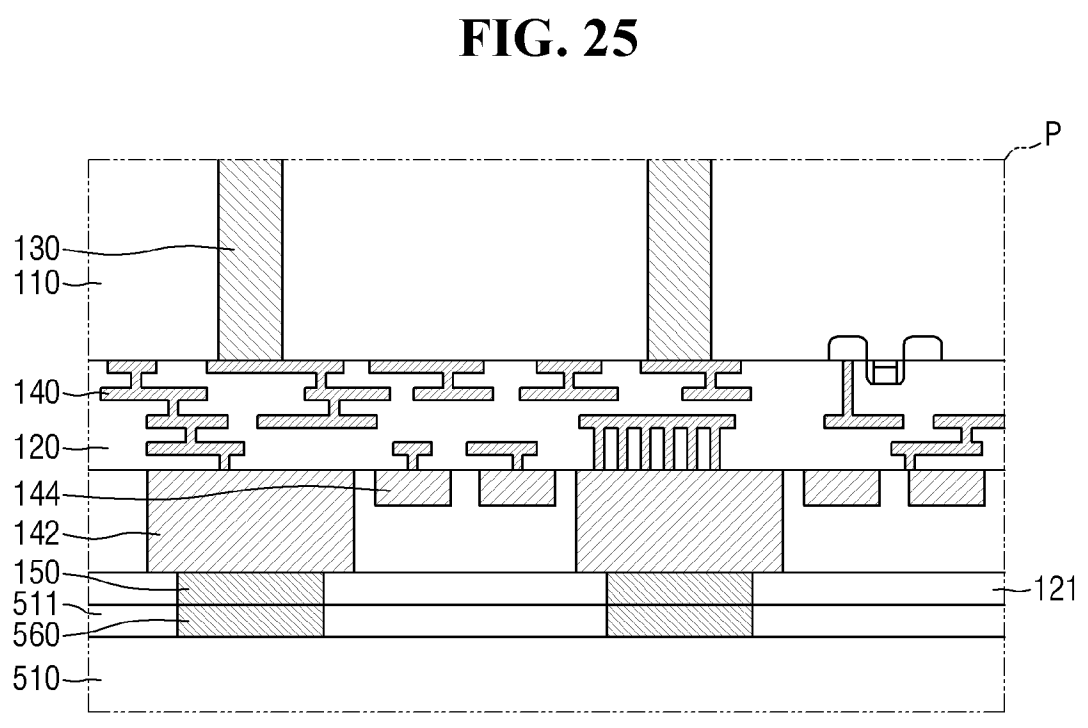

Referring to FIG. 25, the first back bonding pad 150 and the package bonding pad 560 may be bonded.

Since the first back bonding pad 150 expands relatively further than the first passivation layer 121, the first back bonding pad 150 and the package bonding pad 560 may be stably bonded.

On the other hand, for example, referring to FIG. 24, if the first surface 144S1 of the first peripheral wiring pad is disposed on the same plane as the first surface 142S1 of the first connection wiring pad, since the first peripheral wiring pad 144 expands due to annealing, the first passivation layer 121 may also expand. In such a case, since an extent to which the first surface 150S1 of the first back bonding pad protrudes beyond the first surface 121S1 of the first passivation layer decreases, the first back bonding pad 150 may not be stably bonded to the package bonding pad 560.

Since the first surface 144S1 of the first peripheral wiring pad is disposed above the first surface 142S1 of the first connection wiring pad on the basis of the first surface 121S1 of the first passivation layer, even if the first peripheral wiring pad 144 expands due to the annealing, it is possible to reduce the extent to which the first passivation layer 121 expands due to the expansion of the first peripheral wiring pad 144. Therefore, the first surface 150S1 of the first back bonding pad protrudes relatively further than the first surface 121S1 of the first passivation layer, and the first back bonding pad 150 may be stably bonded to the package bonding pad 560.

Figure 26:
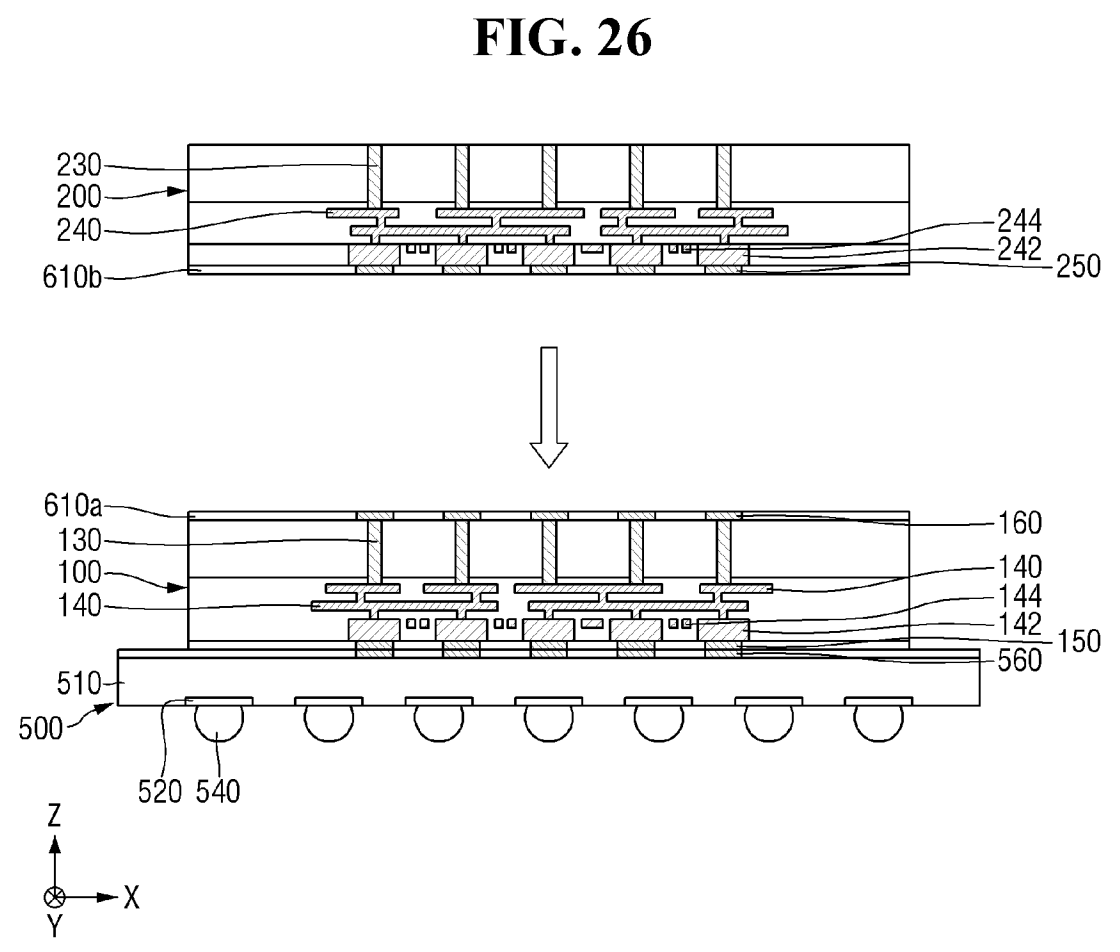

Referring to FIG. 26, the second semiconductor chip 200 may be bonded onto the first semiconductor chip 100.

The first front bonding pad 160 may be formed inside the first portion 610*a* of the first bonding insulation film disposed on the upper face of the first semiconductor chip 100. The second back bonding pad 250 may be formed inside the second portion 610*b* of the first bonding insulation film disposed on the lower face of the second semiconductor chip 200.

The first front bonding pad 160 and the second back bonding pad 250 may be in direct contact with each other to bond the first semiconductor chip 100 and the second semiconductor chip 200.

Similarly, the first semiconductor chip 100 and the second semiconductor chip 200 may be annealed when bonded. The second back bonding pad 250 disposed on the second connection wiring pad 242, which is thicker than the second peripheral wiring pad 244, may protrude relatively further than the second portion 610*b* of the first bonding insulation film due to the annealing. Therefore, the second back bonding pad 250 may be stably bonded to the first front bonding pad 160.

Figure 27:
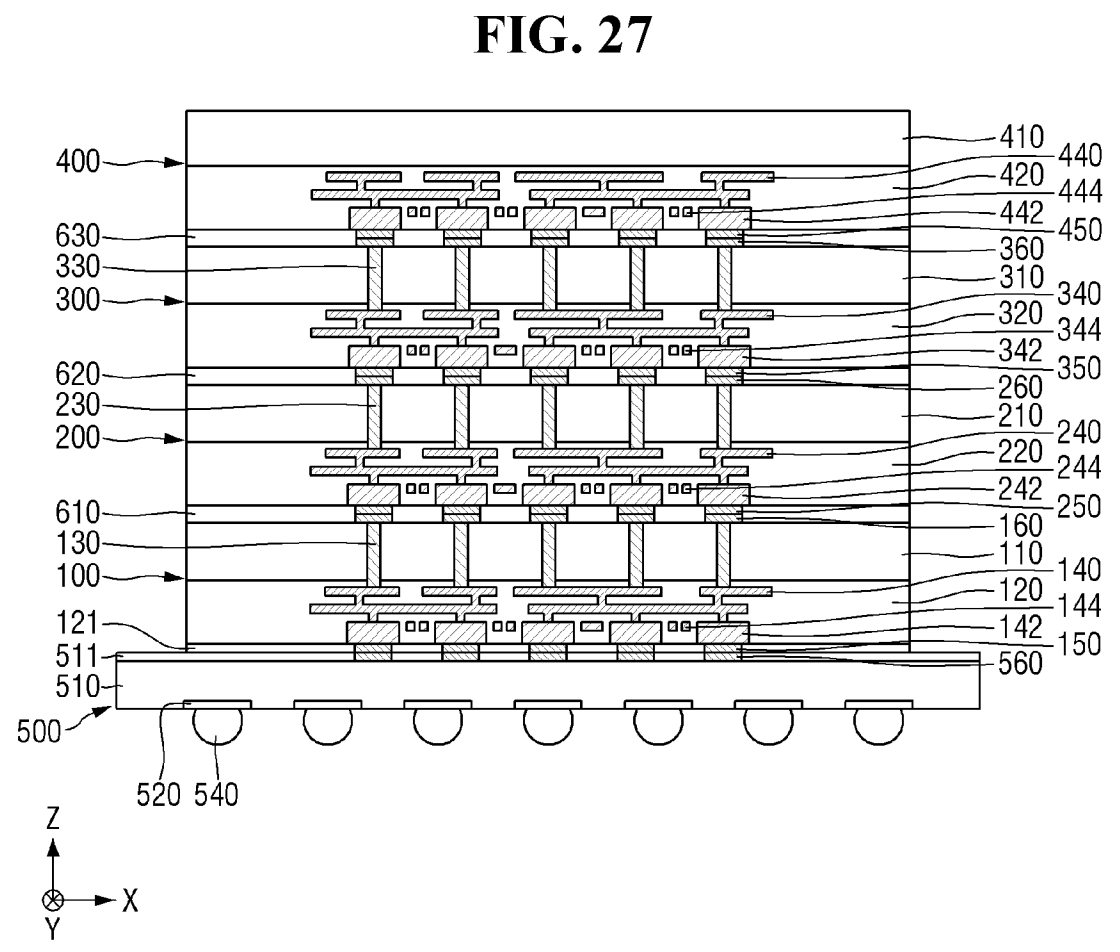

Referring to FIG. 27, the third semiconductor chip 300 and the fourth semiconductor chip 400 may be bonded onto the second semiconductor chip 200.

Next, referring to FIG. 1, a molding film 700 that covers the first to fourth semiconductor chips 100 to 400 may be formed.

Figure 28:
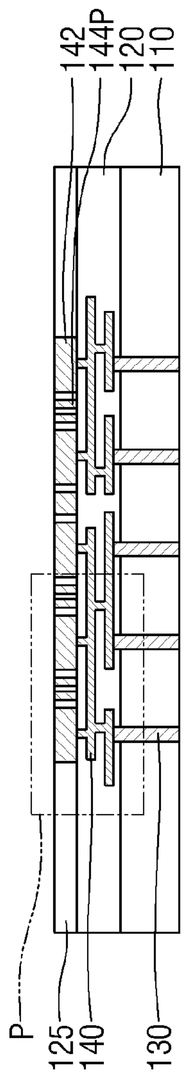

FIGS. 28 to 33 are diagrams illustrating intermediate steps of another example of a method for fabricating a semiconductor package. For convenience of explanation, the explanation will focus on the points that are different from those explained with reference to FIGS. 14 to 27. For reference, FIG. 28 is a diagram showing steps after FIG. 14.

Figure 29:
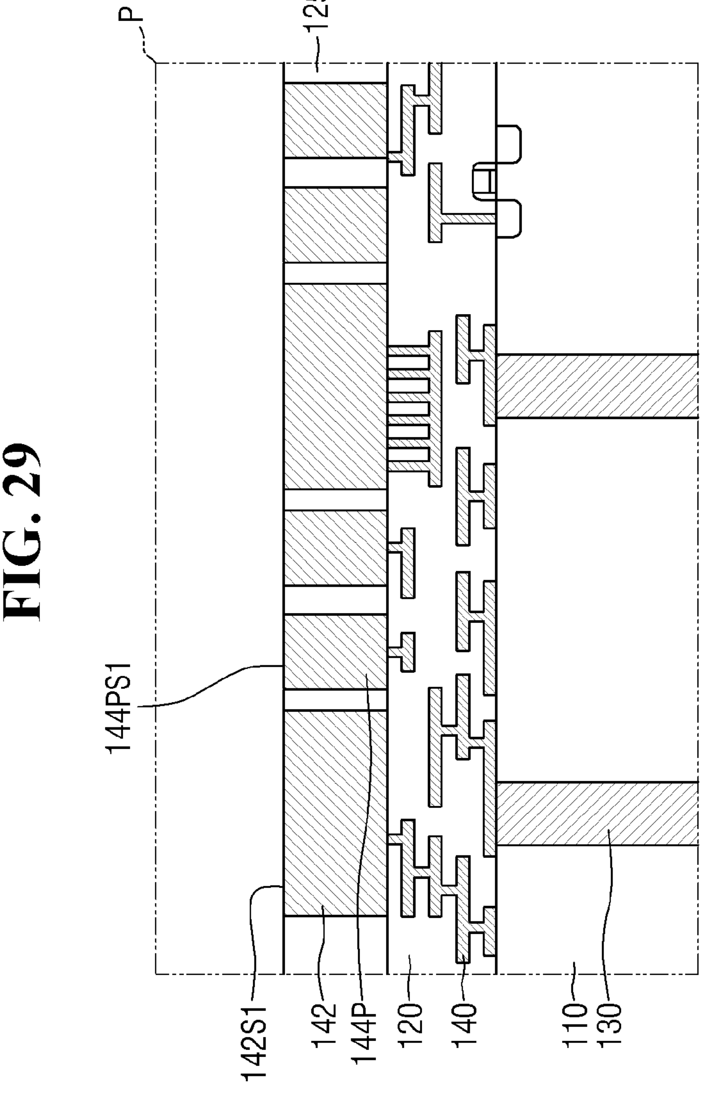

Referring to FIGS. 14, 28, and 29, the first connection wiring pad 142 and a first pre-peripheral wiring pad 144P may be formed.

The first connection wiring pad 142 and the first pre-peripheral wiring pad 144P may be formed inside the first insulating film 125 of the first semiconductor element layer 120. The first connection wiring pad 142 and the first pre-peripheral wiring pad 144P may be connected to the first wiring structure 140.

The first connection wiring pad 142 and the first pre-peripheral wiring pad 144P may have the same thickness. The first surface 142S1 of the first connection wiring pad and the first surface 144PS1 of the first pre-peripheral wiring pad may be disposed on the same plane.

Figure 30:
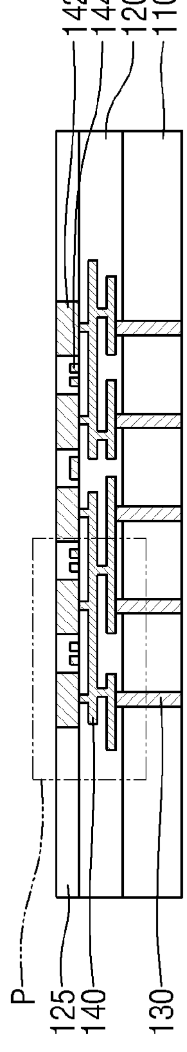

Referring to FIG. 30, the first peripheral wiring pad 144 may be formed inside the first insulating film 125.

Figure 31:
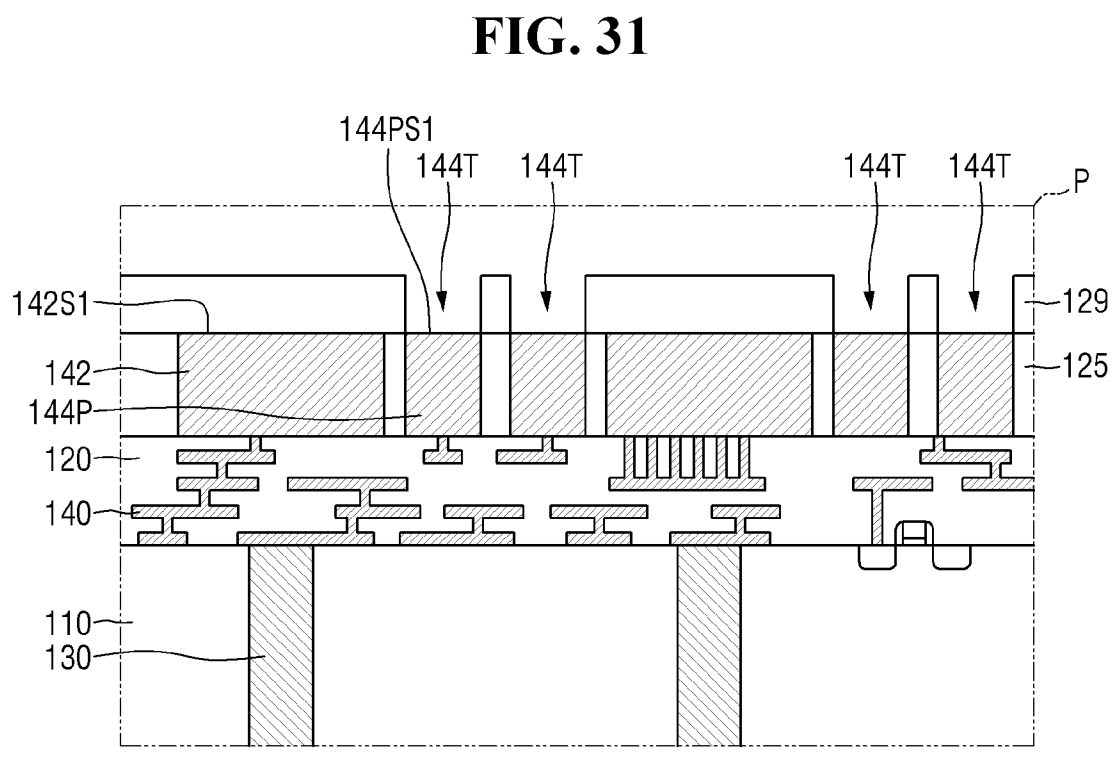

Specifically, referring to FIG. 31, a mask layer 129 may be formed on the first insulating film 125. The mask layer 129 may cover the first connection wiring pad 142.

A first peripheral wiring pad trench 144T which penetrates the mask layer 129 and exposes the first pre-peripheral wiring pad 144P may be formed. The first surface 144PS1 of the first pre-peripheral wiring pad may be exposed by the first peripheral wiring pad trench 144T. The first surface 142S1 of the first connection wiring pad may be covered with the mask layer 129.

Figure 32:
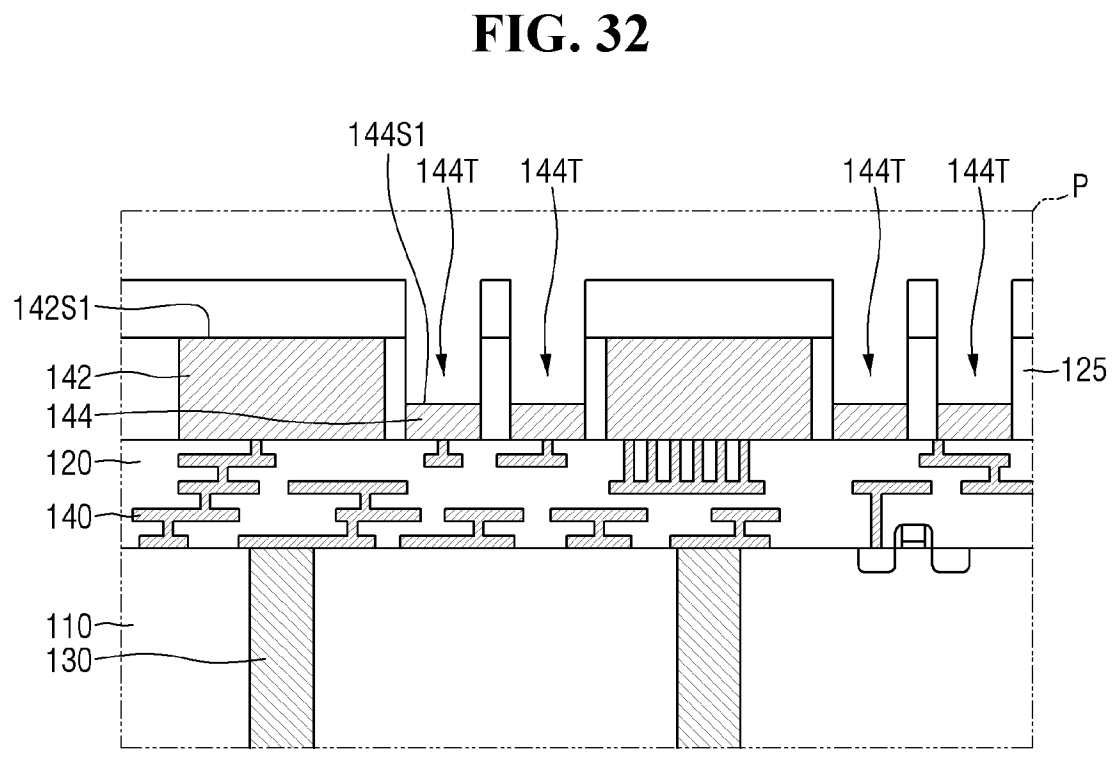

Next, referring to FIG. 32, the upper part of the first pre-peripheral wiring pad (144P of FIG. 31) may be removed inside the first peripheral wiring pad trench 144T. For example, the upper part of the first pre-peripheral wiring pad (144P of FIG. 31) may be etched inside the first peripheral wiring pad trench 144T.

The first peripheral wiring pad 144 may be formed while removing the upper part of the first pre-peripheral wiring pad (144P of FIG. 31). The first surface 144S1 of the first peripheral wiring pad may be located below the first surface 142S1 of the first connection wiring pad on the basis of the first semiconductor substrate 110.

Figure 33:
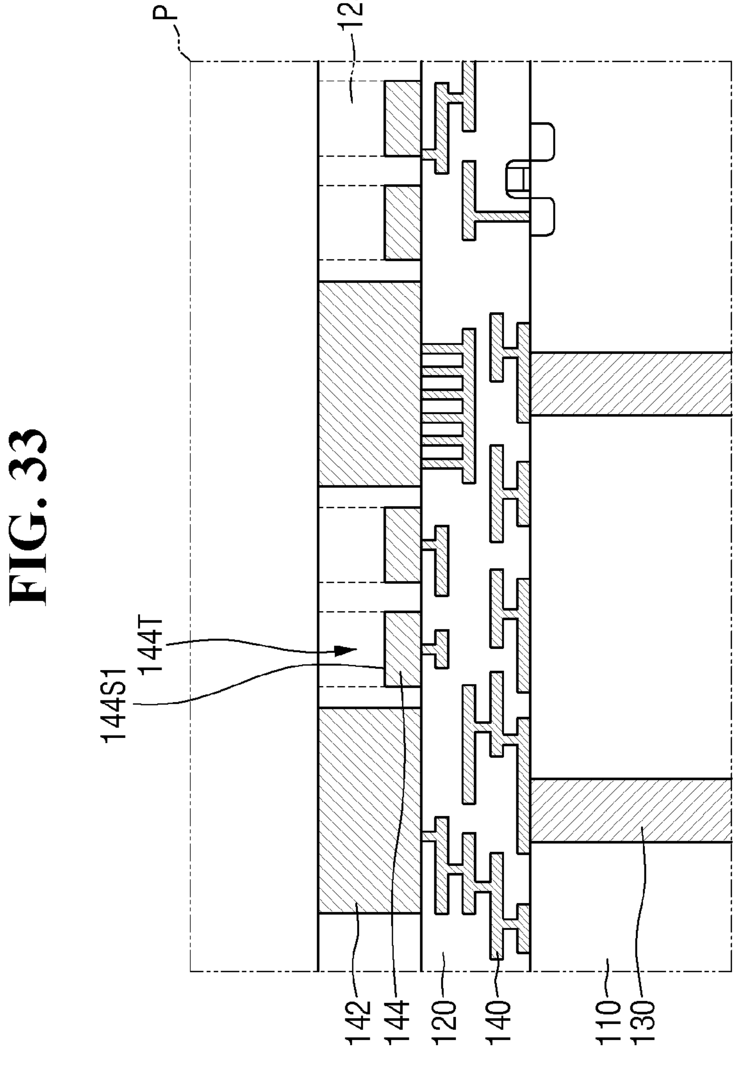

Next, referring to FIG. 33, the first insulating film 125 may be formed inside the first peripheral wiring pad trench 144T. The first insulating film 125 may fill the first peripheral wiring pad trench 144T. The first insulating film 125 may cover the first surface 144S1 of the first peripheral wiring pad inside the first peripheral wiring pad trench 144T.

The explanation of the steps after FIG. 33 is the same as the explanation of FIGS. 21 to 27, and will therefore be omitted.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

In concluding the detailed description, those skilled in the art will appreciate that many variations and modifications may be made to the described implementations without substantially departing from the principles of the present disclosure. Therefore, the disclosed implementations are used in a generic and descriptive sense only and not for purposes of limitation.

What is claimed is:

1. A semiconductor package comprising:
a first semiconductor chip;
a second semiconductor chip on the first semiconductor chip;
a first bonding pad disposed on a first surface of the first semiconductor chip, the first surface facing the second semiconductor chip; and
a second bonding pad disposed on a second surface of the second semiconductor chip, the second surface facing the first surface, and the second bonding pad being in contact with the first bonding pad,
wherein the second bonding pad includes
a third surface that is in contact with the first bonding pad, and
a fourth surface opposite to the third surface,
wherein the second semiconductor chip includes
a first wiring pad that is in contact with the fourth surface of the second bonding pad, and
a second wiring pad which is spaced apart from the first wiring pad and the second bonding pad,
wherein a thickness of the second wiring pad is smaller than a thickness of the first wiring pad.

2. The semiconductor package of claim 1,
wherein the thickness of the second wiring pad is 50% or less of the thickness of the first wiring pad.

3. The semiconductor package of claim 1, comprising:
a bonding insulation film disposed between the first semiconductor chip and the second semiconductor chip, wherein the bonding insulation film surrounds the first bonding pad and the second bonding pad.

4. The semiconductor package of claim 3,
wherein a side face of the bonding insulation film is disposed on a same plane as a side face of the second semiconductor chip.

5. The semiconductor package of claim 1,
wherein the first wiring pad includes
a fifth surface that is in contact with the fourth surface, and
a sixth surface that is opposite to the fifth surface, and
wherein the second wiring pad includes
a seventh surface facing the first semiconductor chip, and
an eighth surface opposite to the seventh surface,
wherein the sixth surface and the eighth surface are disposed on a same plane.

6. The semiconductor package of claim 5,
wherein the second semiconductor chip includes an insulating film that surrounds the first wiring pad and the second wiring pad,
wherein the insulating film covers a side face of the first wiring pad, and does not overlap the fifth surface and the sixth surface, and
wherein the insulating film covers a side face of the second wiring pad and the seventh surface, and does not overlap the eighth surface.

7. The semiconductor package of claim 1,
wherein the second semiconductor chip comprises
a wiring structure connected to the first wiring pad and the second wiring pad;
a semiconductor substrate disposed on the wiring structure; and
a through electrode that extends through the semiconductor substrate and that is connected to the wiring structure.

8. The semiconductor package of claim 1,
wherein the first bonding pad and the second bonding pad include copper (Cu), and
wherein the first wiring pad and the second wiring pad include aluminum (Al).

9. The semiconductor package of claim 1,
wherein a width of the first bonding pad increases in a direction toward the second bonding pad.

10. The semiconductor package of claim 1,
wherein a width of the first bonding pad is greater than a width of the second bonding pad.

11. The semiconductor package of claim 1, comprising:
a package substrate disposed below the first semiconductor chip; and
a molding film which is disposed on the package substrate and covers the first semiconductor chip and the second semiconductor chip.

12. A semiconductor package comprising:
a first semiconductor chip;
a second semiconductor chip on the first semiconductor chip;
a first bonding pad disposed on a first surface of the first semiconductor chip, the first surface facing the second semiconductor chip; and
a second bonding pad disposed on a second surface of the second semiconductor chip, the second surface facing the first surface, and the second bonding pad being in contact with the first bonding pad,
wherein the second semiconductor chip includes
a first wiring pad which is in contact with the second bonding pad, and
a second wiring pad which is spaced apart from the first wiring pad and the second bonding pad,
wherein the first wiring pad includes a third surface that is in contact with the second bonding pad, and a fourth surface opposite to the third surface,
wherein the second wiring pad includes a fifth surface facing the first semiconductor chip, and a sixth surface opposite to the fifth surface,
wherein the fourth surface and the sixth surface are disposed on a same plane, and
wherein the third surface is located below the fifth surface with respect to the first surface of the first semiconductor chip.

13. The semiconductor package of claim 12,
wherein a first thickness between the fifth surface and the sixth surface is 50% or less of a second thickness between the third surface and the fourth surface.

14. The semiconductor package of claim 12,
wherein the second semiconductor chip comprises an insulating film that surrounds a side face of the first wiring pad,
wherein the insulating film does not overlap the third surface of the first wiring pad, and wherein the insulating film overlaps the fifth surface of the second wiring pad.

15. The semiconductor package of claim 12, wherein the first bonding pad and the second bonding pad include copper (Cu), and wherein the first wiring pad and the second wiring pad include aluminum (Al).

16. The semiconductor package of claim 12, wherein the first semiconductor chip includes a through electrode connected to the first bonding pad.

17. The semiconductor package of claim 16, wherein a width of the through electrode is smaller than a width of the first bonding pad.

18. The semiconductor package of claim 12, wherein a width of the first wiring pad is greater than a width of the second bonding pad.

19. The semiconductor package of claim 12, wherein the second semiconductor chip comprises an insulating film which surrounds a side face of the first wiring pad and a side face of the second wiring pad, and wherein the insulating film is not disposed between the second bonding pad and the first wiring pad.

20. A semiconductor package comprising:

a package substrate;

a first semiconductor chip on the package substrate;

a second semiconductor chip on the first semiconductor chip;

a first bonding pad disposed on a first surface of the first semiconductor chip, the first surface facing the second semiconductor chip;

a second bonding pad disposed on a second surface of the second semiconductor chip, the second surface facing the first surface, and the second bonding pad being in contact with the first bonding pad; and a molding film disposed on the package substrate, wherein the molding film covers the first semiconductor chip and the second semiconductor chip, wherein the second bonding pad includes a third surface that is in contact with the first bonding pad, and a fourth surface opposite to the third surface, wherein the first semiconductor chip includes a first through electrode that is in contact with the first bonding pad, and a first wiring structure connected to the first through electrode, wherein the second semiconductor chip includes a first wiring pad that is in contact with the fourth surface of the second bonding pad, a second wiring structure including a second wiring pad that is spaced apart from the first wiring pad and the second bonding pad, and a second through electrode connected to the second wiring structure, wherein the first bonding pad and the second bonding pad include copper (Cu), wherein the first wiring pad and the second wiring pad include aluminum (Al), and wherein a thickness of the second wiring pad is 50% or less of a thickness of the first wiring pad.

* * * * *